(12) United States Patent
Sakashita et al.

(10) Patent No.: US 7,713,765 B2
(45) Date of Patent: May 11, 2010

(54) OPTICAL SEMICONDUCTOR DEVICE AND METHOD FOR MANUFACTURING THE SAME

(75) Inventors: Takeshi Sakashita, Kanagawa (JP); Masanori Saito, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 142 days.

(21) Appl. No.: 12/180,801

(22) Filed: Jul. 28, 2008

(65) Prior Publication Data

US 2009/0028203 A1 Jan. 29, 2009

(30) Foreign Application Priority Data

Jul. 27, 2007 (JP) ............................. 2007-195635
Jul. 7, 2008 (JP) ............................. 2008-177391

(51) Int. Cl.
*H01L 21/00* (2006.01)

(52) U.S. Cl. ............................. 438/20; 438/22; 438/29; 257/79; 257/E27.12; 257/E21.057; 257/E21.135; 372/46.01; 372/46.015

(58) Field of Classification Search ................ 438/20, 438/22, 29; 257/79, E27.12, E21.057, E21.135; 372/46.01, 46.015, 46.016
See application file for complete search history.

(56) References Cited

U.S. PATENT DOCUMENTS 7,613,220 B2 * 11/2009 Takayama et al. ...... 372/50.121

FOREIGN PATENT DOCUMENTS

JP 05-218593 A 8/1993
JP 2006-303211 A 11/2006

* cited by examiner

*Primary Examiner*—Hsien-ming Lee
(74) *Attorney, Agent, or Firm*—Westerman, Hattori, Daniels & Adrian, LLP

(57) ABSTRACT

A method for manufacturing a semiconductor device having a compound semiconductor layer that is provided on a substrate and includes a cladding layer of a first conductivity type, an activation layer, a cladding layer of a second conductivity type that is the opposite of the first conductivity type, includes the steps of: forming a diffusion source layer on the compound semiconductor layer; forming a first diffusion region in the compound semiconductor layer by carrying out a first heat treatment, so that the first diffusion region includes a light emitting facet for emitting light from the activation layer; removing the diffusion source layer; forming a first SiN film having a refractive index of 1.9 or higher on the compound semiconductor layer; and turning the first diffusion region into the second diffusion region by carrying out a second heat treatment.

14 Claims, 19 Drawing Sheets

DISTANCE FROM SURFACE OF COMPOUND
SEMICONDUCTOR LAYER 22 (μm)

ENLARGED

DISTANCE FROM SURFACE OF COMPOUND
SEMICONDUCTOR LAYER 22 (μm)

OPTICAL SEMICONDUCTOR DEVICE AND METHOD FOR MANUFACTURING THE SAME

BACKGROUND OF THE INVENTION

1. Field of the Invention

The present invention generally relates to an optical semiconductor device and a method for manufacturing the optical semiconductor device. More particularly, the present invention relates to an optical semiconductor device having a diffusion region that includes a light emitting facet and has impurities diffused therein, and a method for manufacturing the optical semiconductor device.

2. Description of the Related Art

In recent years, optical semiconductor devices such as laser diodes (LDs) that emit light are used in the fields of optical communications and optical storage media. In high-power laser diodes, optical damage called COD (Catastrophic Optical Damage) has become a problem and caused decreases in reliability. COD is caused when the light emitting facet through which laser light is emitted serves as an absorbing area for the laser light.

To prevent COD, there has been a technique by which the bandgap of the activation layer of the light emitting facet for emitting laser light is made wider than the activation layer located on the inner side of the light emitting facet. By this technique, absorption of the laser light on the light emitting facet is prevented, and COD can be prevented accordingly. To widen the bandgap of the activation layer of the light emitting facet, a diffusion region having impurities diffused therein is often formed.

However, if the impurity concentration in the diffusion region is too high, the light absorption by the free carriers becomes large, and the problem of COD arises again. Japanese Patent Application Publication Nos. 5-218593 and 2006-303211 disclose techniques by which the diffusion region having impurities diffused therein is subjected to another heat treatment.

In optical semiconductor devices, breaking on the light emitting facet caused by COD is often found through an APC (Auto Power Control) reliability test and pulse I-L measurement carried out to evaluate optical output power characteristics. As a result, the problem of poorer reliability arises.

With a technique of subjecting the diffusion region to another heat treatment as disclosed in Japanese Patent Application Publication Nos. 5-218593 and 2006-303211, there is the problem of defects formed in the surface of a compound semiconductor layer such as a cladding layer or an activation layer formed on the substrate.

SUMMARY OF THE INVENTION

It is therefore an object of the present invention to provide an optical semiconductor device and a method for manufacturing the optical semiconductor device in which the above disadvantages are eliminated.

A more specific object of the present invention is to provide an optical semiconductor device that can prevent a decrease in reliability and has no defects formed in the surface of the compound semiconductor layer, and a method for manufacturing the optical semiconductor device.

According to an aspect of the present invention, there is provided a method for manufacturing a semiconductor device that has a compound semiconductor layer on a substrate, the compound semiconductor layer including a cladding layer of a first conductivity type, an activation layer, a cladding layer of a second conductivity type that is the opposite of the first conductivity type, the method comprising the steps of: forming a diffusion source layer on the compound semiconductor layer; forming a first diffusion region in the compound semiconductor layer by carrying out a first heat treatment, the first diffusion region including a light emitting facet for emitting light from the activation layer; removing the diffusion source layer; forming a first SiN film having a refractive index of 1.9 or higher on the compound semiconductor layer; and turning the first diffusion region into the second diffusion region by carrying out a second heat treatment. In accordance with this invention, the second diffusion region that has low impurity concentration and has a uniform impurity concentration distribution in the area extending from the cladding layer of the second conductivity type to the activation layer can be formed in the compound semiconductor layer including the light emitting facet. Accordingly, it is possible to prevent a decrease in the reliability of the optical semiconductor device due to COD. Also, before the first region layer is subjected to a heat treatment, a SiN film having a refractive index of 1.9 or higher is formed on the compound semiconductor layer. With this arrangement, defects are not formed in the surface of the compound semiconductor layer.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1A:
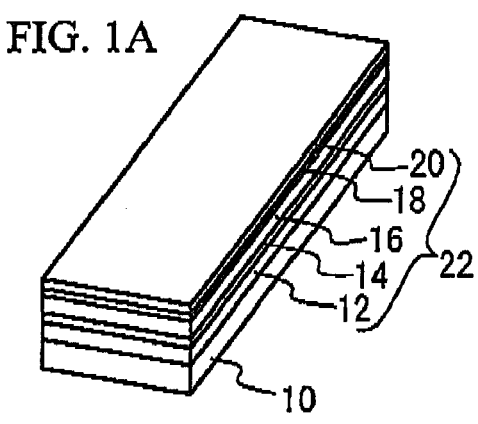
FIGS. 1A through 1E are schematic perspective views illustrating a method for manufacturing an optical semiconductor device in accordance with Comparative Example 1.

First, an optical semiconductor device (a laser diode) in accordance with Comparative Example 1 manufactured by a conventional manufacturing method is described. FIGS. 1A through 1E are schematic perspective views illustrating the method for manufacturing the optical semiconductor device of Comparative Example 1. As shown in FIG. 1A, a 2.6-μm thick cladding layer 12 of a first conductivity type that is formed with an n-type AlGaInP layer, a 20-nm thick activation layer 14 that is formed with a MQW (multiquantum well) of AlGaInP/InGaP, a 2.0-μm thick cladding layer 16 of a second conductivity type that is formed with a p-type AlGaInP layer, a 30-nm thick stopper layer 18 that is formed with an InGaP layer, and a 0.2-μm thick p-type contact layer 20 that is formed with a p-type GaAs layer are grown by MOCVD (metal-organic chemical vapor deposition) on a substrate 10 formed with an n-type GaAs substrate. With this arrangement, a compound semiconductor layer 22 is formed on the substrate 10.

Figure 1D:
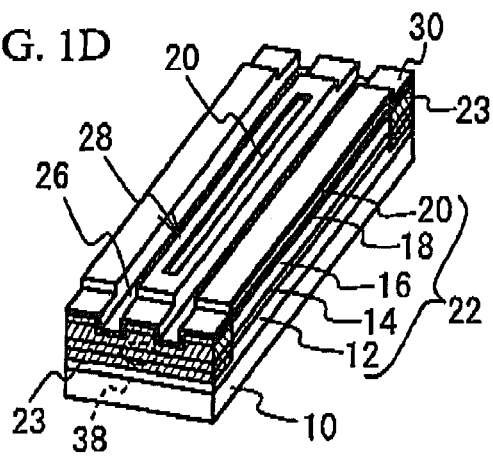
Figure 1B:
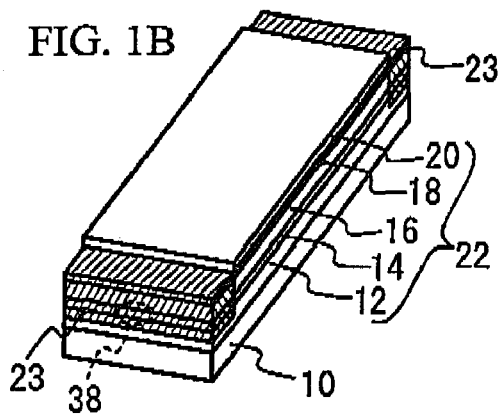

Referring now to FIG. 1B, a mask layer (not shown) formed with a SiN layer is formed on the p-type contact layer 20 by CVD, for example. A photoresist (not shown) having an opening to form a first diffusion region 23 is formed on the mask layer. With the photoresist serving as a mask, the mask layer is removed. After the photoresist is removed from the entire surface, a diffusion source layer (not shown) is formed on the mask layer, and the Zn contained in the diffusion source layer is diffused into the p-type contact layer 20, the stopper layer 18, the cladding layer 16 of the second conductivity type, the activation layer 14, and the cladding layer 12 of the first conductivity type. By doing so, the first diffusion region 23 is formed to surround a light emitting facet 38 for emitting light from the activation layer 14. After the mask layer and the diffusion source layer are removed, a photoresist (not shown) having an opening at the first diffusion region 23 is again formed. With the photoresist serving as a mask, the p-type contact layer 20 is removed. The photoresist is then removed from the entire surface.

Figure 1E:
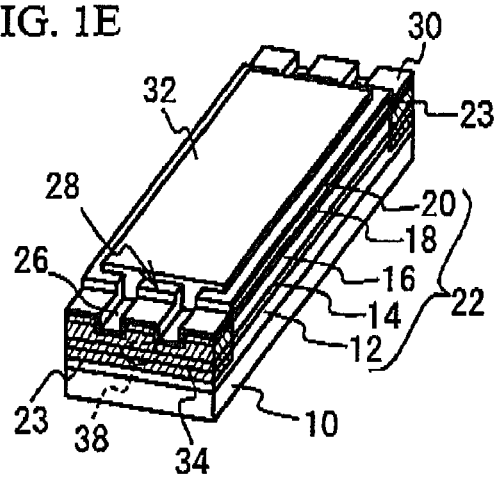
Figure 1C:
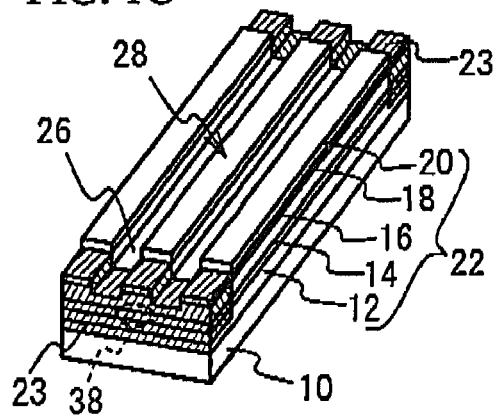

As shown in FIG. 1C, a SiO₂ film (not shown) is formed on the stopper layer 18 and the remaining p-type contact layer 20. A photoresist (not shown) having openings to form concave portions 26 is formed on the SiO₂ film. With the photoresist serving as a mask, the SiO₂ film is removed. The photoresist is then removed from the entire surface. With the SiO₂ film serving as a mask, the p-type contact layer 20, the stopper layer 18, and the cladding layer 16 of the second conductivity type are partially removed, so that the cladding layer 16 of the second conductivity type can be reached. In this manner, a ridge portion 28 interposed between the concave portions 26 is formed. The SiO₂ film is then removed from the entire surface.

As shown in FIG. 1D, a protection layer 30 formed with a SiN layer is formed to cover the p-type contact layer 20, the stopper layer 18, and the cladding layer 16 of the second conductivity type. A photoresist (not shown) having an opening corresponding to the upper face of the ridge portion 28 is formed on the protection layer 30. With the photoresist serving as a mask, etching is performed on the protection layer 30. As a result, the p-type contact layer 20 is exposed through the ridge portion 28. After that, the photoresist is removed from the entire surface.

As shown in FIG. 1E, Ti, Mo, and Au are deposited one by one on the protection layer 30 by a vapor deposition technique, so as to form a p-side electrode 32 in contact with the p-type contact layer 20 exposed through the ridge portion 28. A low-reflection film (not shown) is formed at the end face 34 of the end races of the compound semiconductor layer 22 on the side of the light emitting facet 38. A high-reflection film (not shown) is formed at the end face on the opposite side (not shown). In this manner, the optical semiconductor device in accordance with Comparative Example 1 is completed.

Figure 2A:
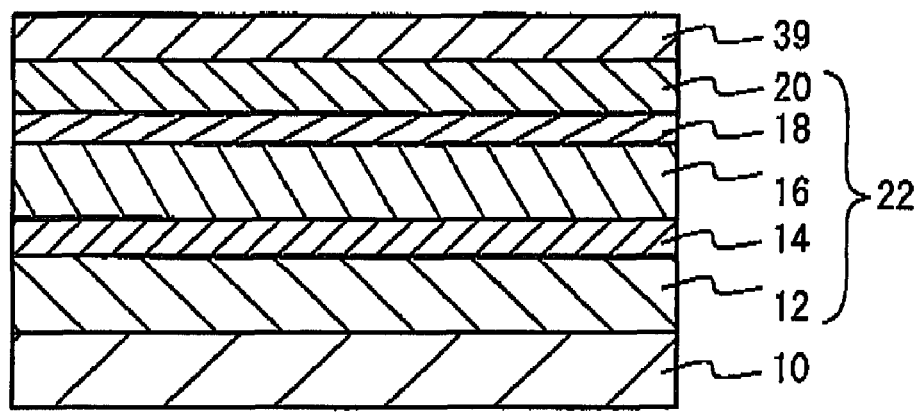
FIGS. 2A through 2C are schematic cross-sectional views illustrating the first half of the procedures for forming the first diffusion region of the optical semiconductor device in accordance with Comparative Example 1.

The formation of the first diffusion region 23 described with reference to FIG. 1B is now explained in greater detail. FIGS. 2A through 3C are schematic cross-sectional views illustrating the method for forming the first diffusion region 23. As shown in FIG. 2A, a 150-nm thick mask layer 39 formed with a SiN layer is formed by CVD, for example, on the compound semiconductor layer 22 that is located on the substrate 10 and includes the cladding layer 12 of the first conductivity type, the activation layer 14, the cladding layer 16 of the second conductivity type, the stopper layer 18, and the p-type contact layer 20.

Figure 2B:
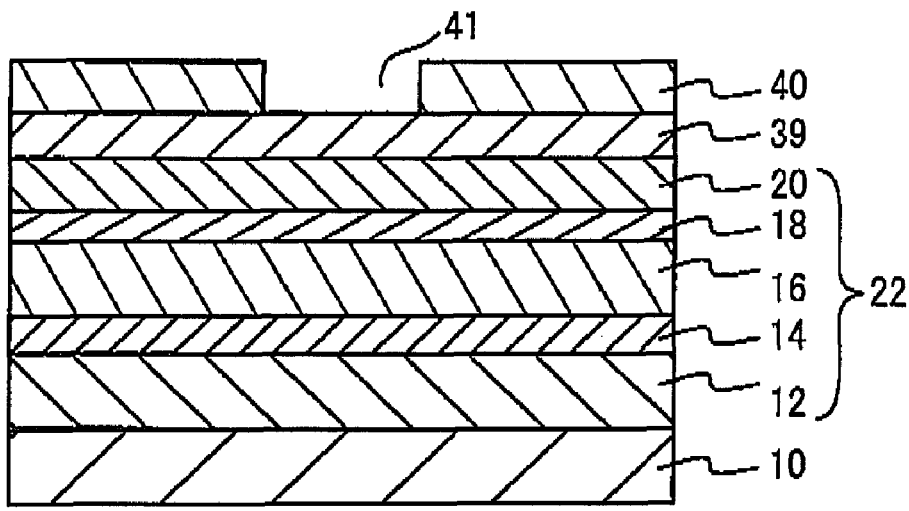
Figure 2C:
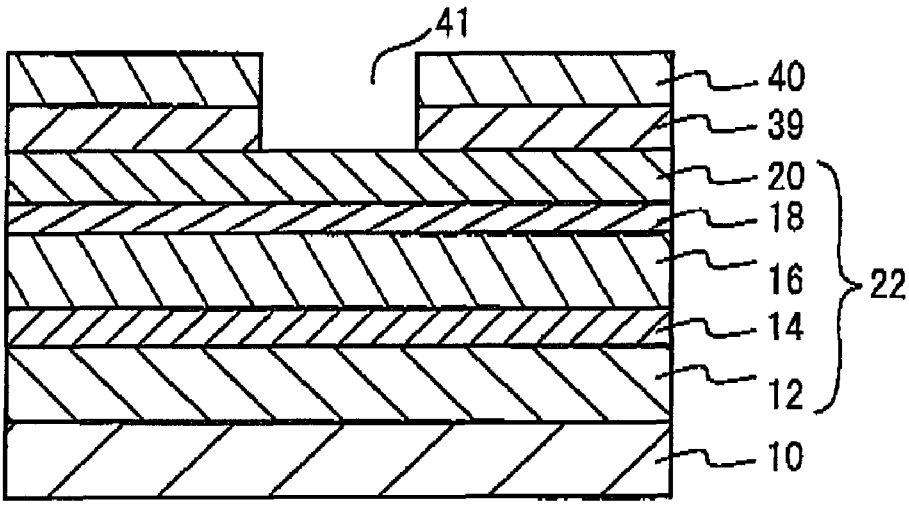

As shown in FIG. 2B, a photoresist 40 is applied onto the mask layer 39, and an opening 41 is formed at the location to form the first diffusion region 23. As shown in FIG. 2C, with the photoresist 40 being used as a mask, etching is performed on the mask layer 39. Xn this manner, the opening 41 extends through the mask layer 39.

Figure 3A:
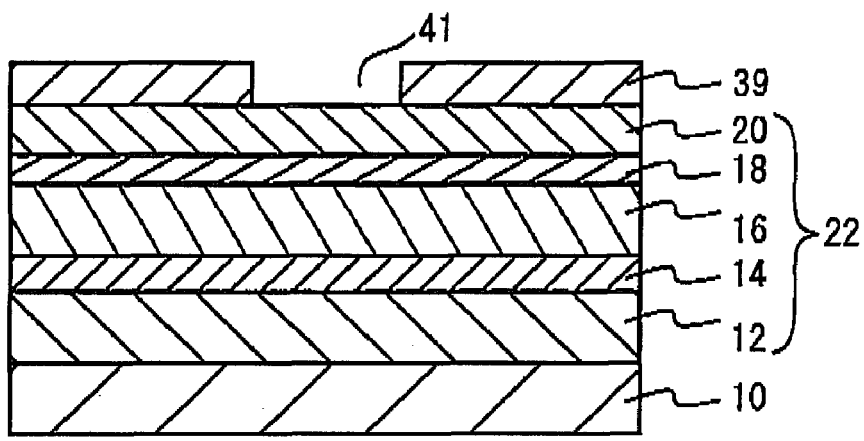
FIGS. 3A through 3C are schematic cross-sectional views illustrating the second half of the procedures for forming the first diffusion region of the optical semiconductor device in accordance with Comparative Example 1.
Figure 3B:
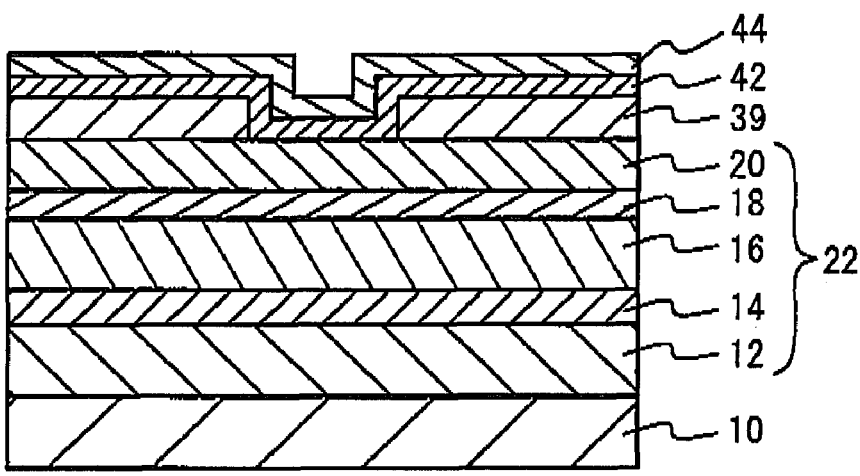
Figure 3C:
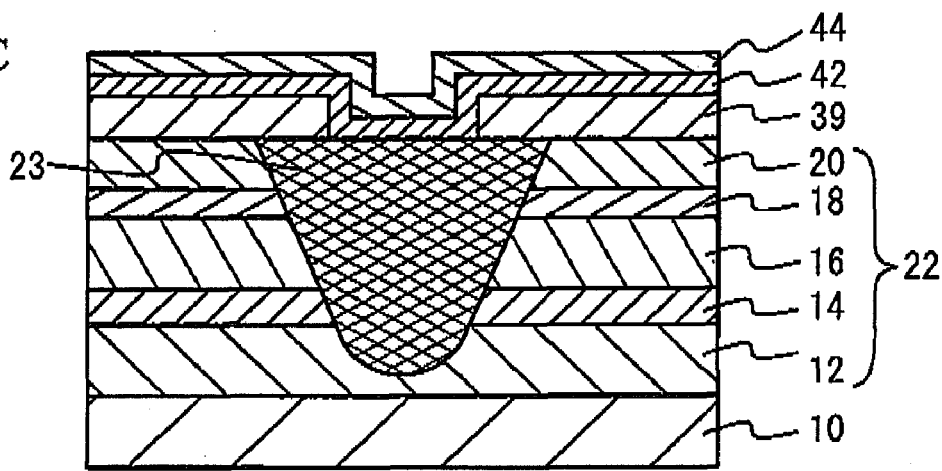

As shown in FIG. 3A, the photoresist 40 is removed. As shown in FIG. 3B, a 100-nm thick diffusion source layer 42 that is formed with a mixed layer of ZnO and SiO$_2$ and covers the opening 41 is formed on the mask layer 39 by a sputtering technique, for example. A 30-nm thick cap layer 44 formed with a SiO$_2$ layer is formed on the diffusion source layer 42. As shown in FIG. 3C, the diffusion source layer 42 is subjected to a heat treatment at 610° C. for 9 minutes. As a result, the Zn in the diffusion source layer 42 is diffused into the compound semiconductor layer 22, and forms the first diffusion region 23. The first diffusion region 23 is designed to extend to the activation layer 14, or extend to a lower region of the compound semiconductor layer 22. Through these procedures, the first diffusion region 23 of the optical semiconductor device in accordance with Comparative Example 1 is formed.

Figure 4:
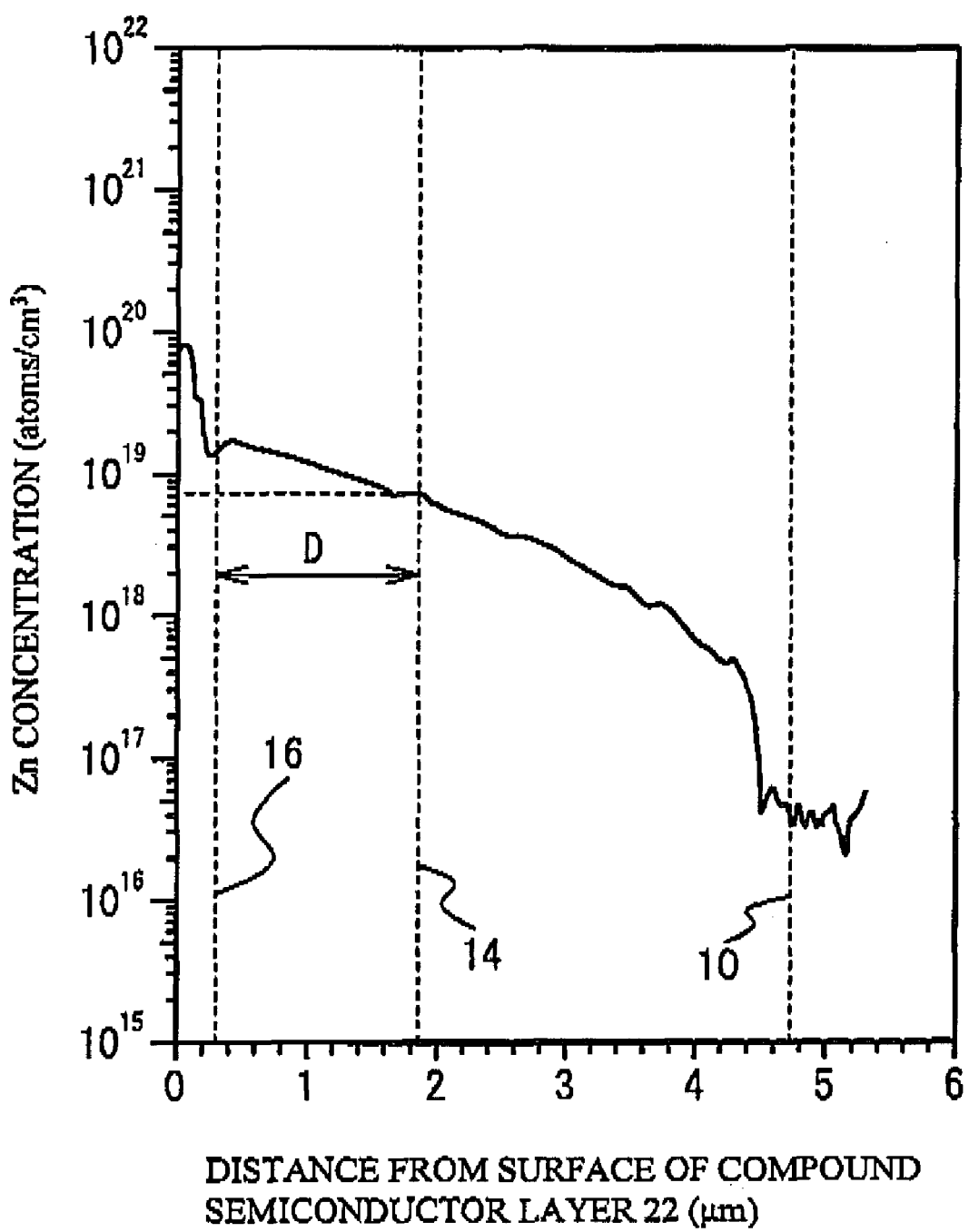
FIG. 4 shows the results of secondary ion mass spectrometric (SIMS) evaluations made on the Zn concentration distribution in the first diffusion region of the optical semiconductor device of Comparative Example 1.

FIG. 4 shows the results of secondary ion mass spectrometric (SIMS) evaluations made on the Zn concentration distribution in the first diffusion region 23 of the optical semiconductor device of Comparative Example 1. In FIG. 4, the abscissa axis indicates the distance from the surface of the compound semiconductor layer 22, and the ordinate axis indicates the Zn concentration. When the Zn concentration is $1\times10^{18}$/cm$^3$ or higher, part of the Zn is not accommodated in the lattice positions, and exists interstitially. While the device is operating, the excess Zn easily moves interstitially and causes degradation in the device. Therefore, it is preferable to restrict the Zn concentration to a lowest possible value. If the Zn concentration is too low, however, an effect of bandgap widening due to disordering cannot be sufficiently achieved. In view of this, a target value of the Zn concentration is approximately $1\times10^{18}$/cm$^3$, for example. As shown in FIG. 4, the Zn concentration in the activation layer 14 is approximately $8\times10^{18}$/cm$^3$, which is higher than the target value. The Zn concentration distribution in the area (an area D) extending from the upper face of the cladding layer 16 of the second conductivity type to the lower face of the activation layer 14 is large, and the ratio of the standard deviation σ in the area D to the mean value in the area D is approximately 30%.

In the optical semiconductor device in accordance with Comparative Example 1, the diffusion source layer 42 is subjected to a heat treatment, so as to form the first diffusion region 23 in the compound semiconductor layer 22, as described with reference to FIG. 3C. Since the first diffusion region 23 is designed to extend to the activation layer 14, the time required for the heat treatment on the diffusion source layer 42 is long. As a result, a larger amount of Zn is diffused into the compound semiconductor layer 22. The Zn concentration in the first diffusion region 23 in the vicinity of the diffusion source layer 42 becomes higher accordingly, and the Zn concentration in the activation layer 14 also becomes higher. Further, the Zn concentration distribution in the area extending from the upper face of the cladding layer 16 of the second conductivity type to the lower face of the activation layer 14 becomes larger.

Figure 5:
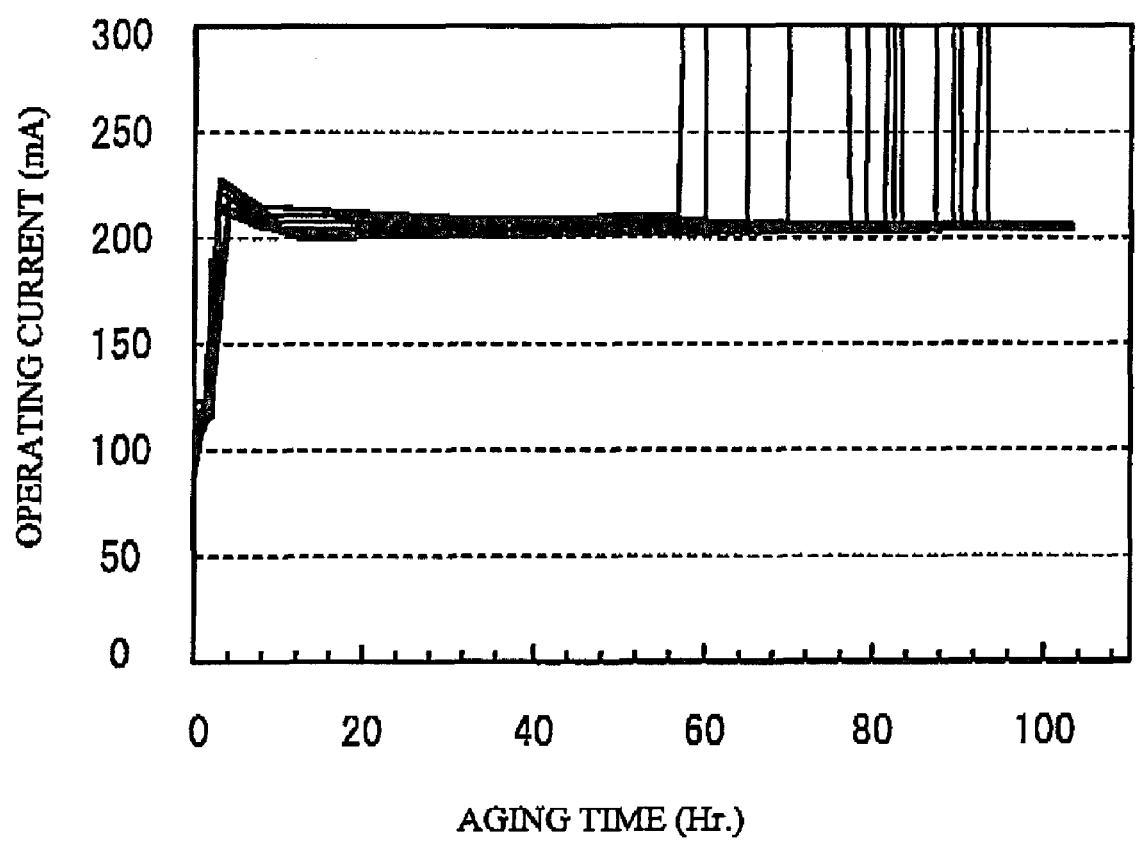
FIG. 5 shows the results of an APC reliability test conducted on the optical semiconductor device in accordance with Comparative Example 1.

FIG. 5 shows the results of an APC (Auto Power Control) reliability test conducted on the optical semiconductor device having the first diffusion region 23 with the above Zn concentration in accordance with Comparative Example 1. In FIG. 5, the abscissa axis indicates the aging time, and the ordinate axis indicates the operating current. The test is conducted at an ambient temperature of 75° C., with the optical output power being fixed at 100 mW. As can be seen from FIG. 5, a rapid increase of the operating current is caused around the time when the aging time is 60 hours. This is because the Zn concentration in the first diffusion region 23 in the activation layer is high, and the light absorption by free carriers becomes larger. The breaking caused due to COD in the vicinity of the light emitting facet 38 results in the rapid increase.

Figure 6:
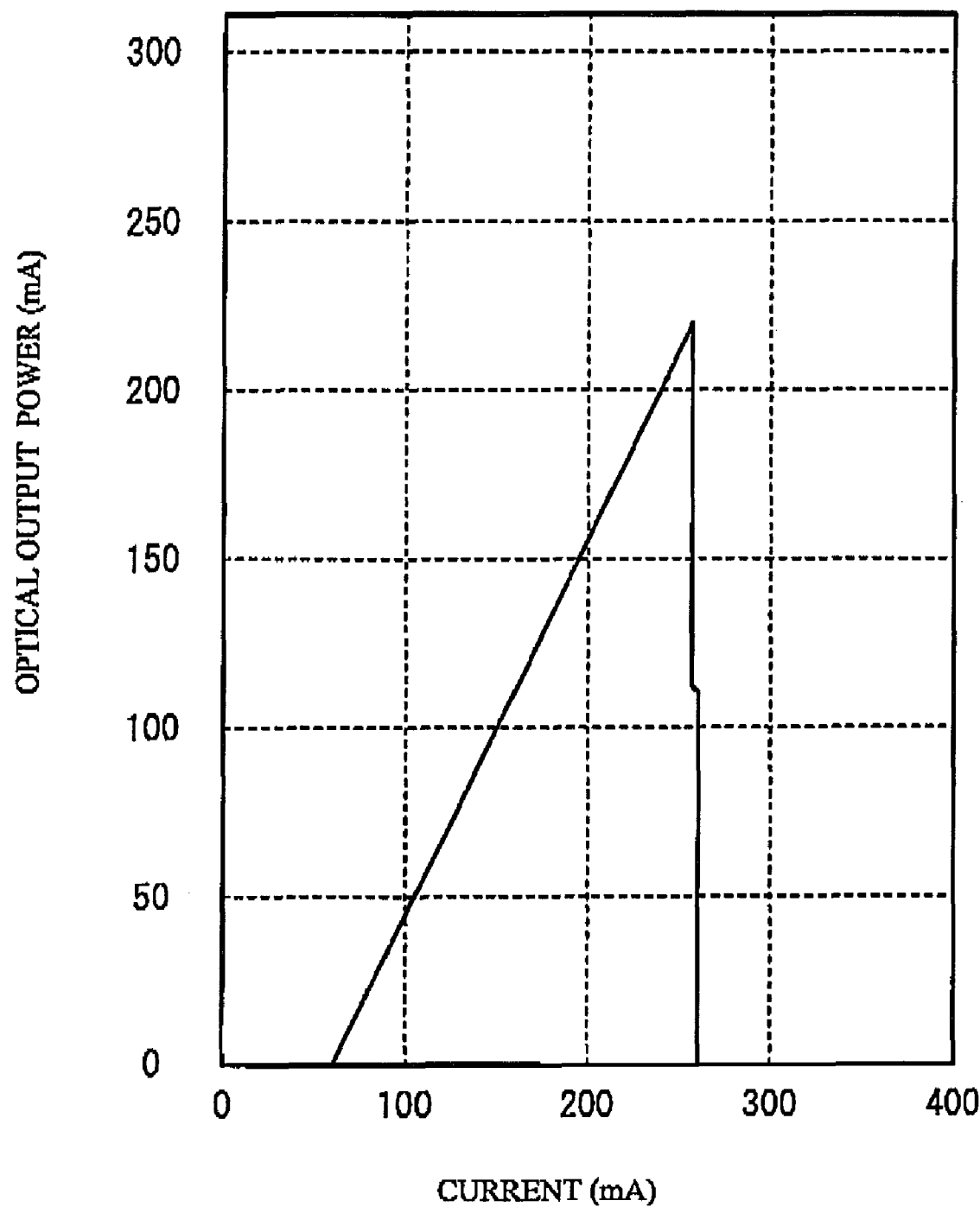
FIG. 6 shows the results of pulse I-L measurement carried out on the optical semiconductor device in accordance with Comparative Example 1.

Pulse I-L measurement is then carried out on the optical semiconductor device of Comparative Example 1, if the optical semiconductor device passes the APC reliability test conducted for 100 hours. FIG. 6 shows the results of the pulse I-L measurement. In FIG. 6, the abscissa axis indicates the current, and the ordinate axis indicates the optical output power. As can be seen from FIG. 6, the optical output power is 0 mW when the current is in the neighborhood of 250 mA, and the optical semiconductor device breaks down, before the optical output power reaches 300 mW, which is a defined optical output power. This is because the concentration distribution of the Zn of the first diffusion region 23 is larger in the area extending from the upper face of the cladding layer 16 of the second conductivity type to the lower face of the activation layer 14, and the Zn moves from the region with higher concentration to the region with lower concentration as the operating current flows during the APC reliability test. The concentration then becomes uniform. The Zn concentration in the activation layer 14 becomes higher accordingly, and the light absorption by free carriers becomes larger. The region in the vicinity of the light emitting facet 38 breaks down due to COD in the pulse I-L measurement. As a result, the optical semiconductor device breaks down.

As described above, the optical semiconductor device of Comparative Example 1 has the problem in reliability. Embodiments developed to counter this problem are described below.

First Embodiment

Figure 7:
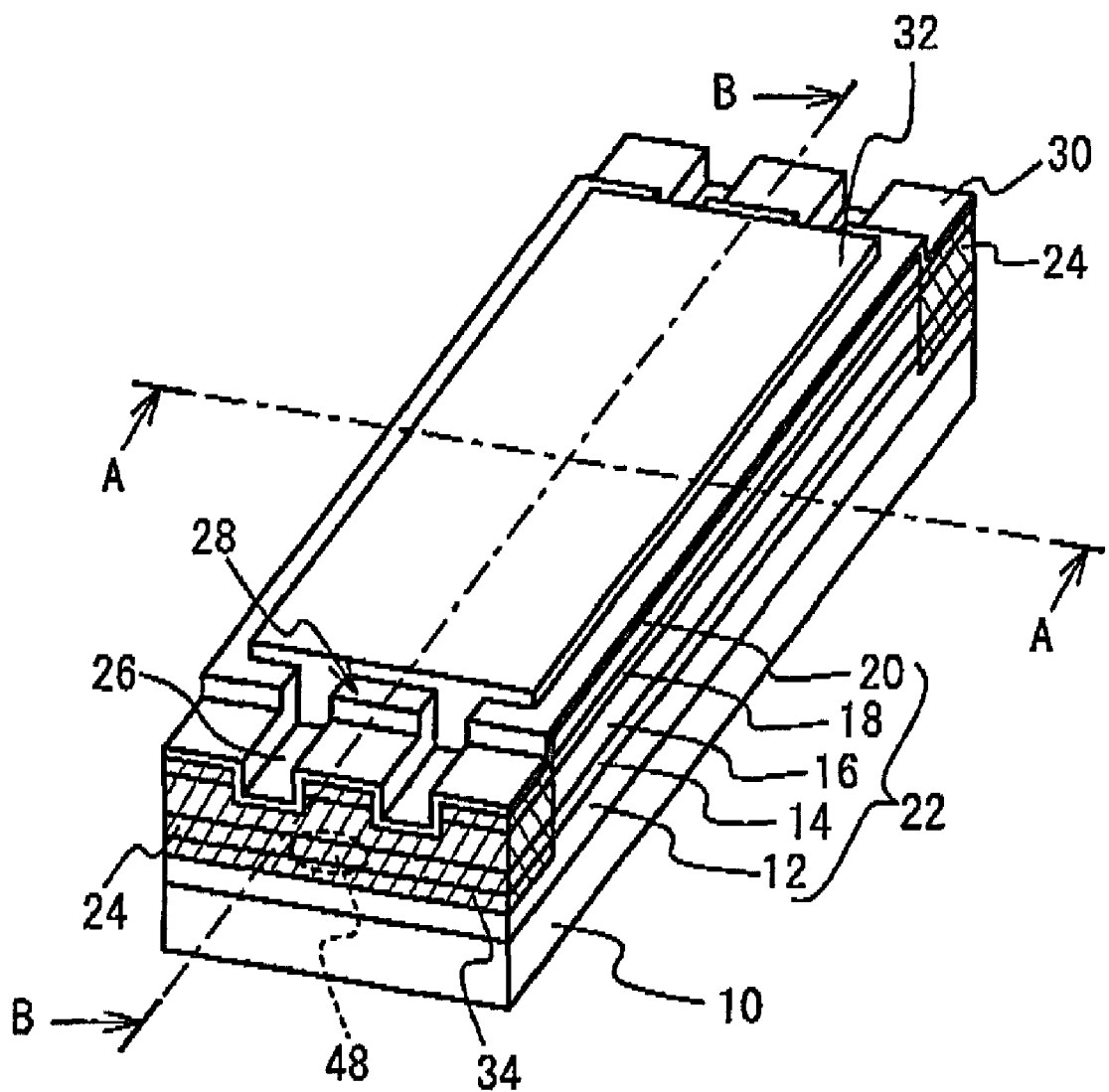
FIG. 7 is a schematic perspective view of an optical semiconductor device in accordance with a first embodiment of the present invention.
Figure 8A:
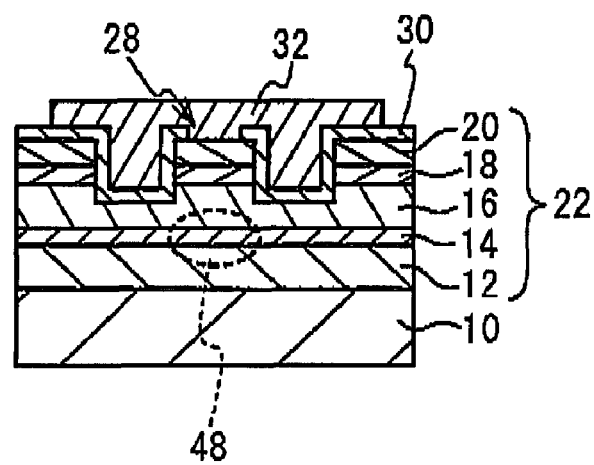
FIG. 8A is a schematic cross-sectional view of the optical semiconductor device, taken along the line A-A of FIG. 7.
Figure 8B:
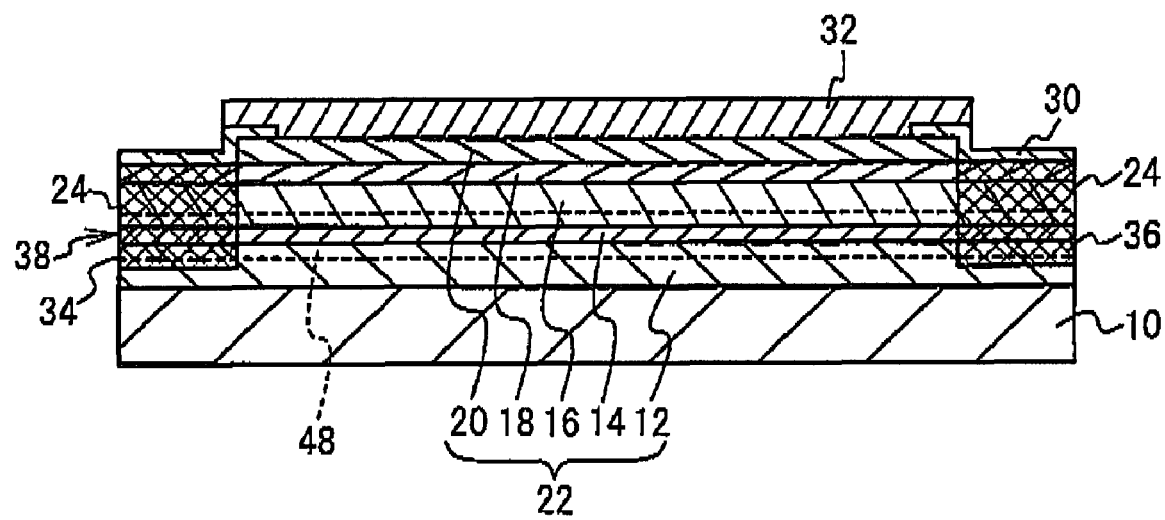
FIG. 8B is a schematic cross-sectional view of the optical semiconductor device, taken along the line B-B of FIG. 7.

FIG. 7 is a schematic perspective view of an optical semiconductor device (a laser diode) in accordance with a first embodiment of the present invention. FIG. 8A is a schematic cross-sectional view of the optical semiconductor device, taken along the line A-A of FIG. 7. FIG. 8B is a schematic cross-sectional view of the optical semiconductor device, taken along the line B-B of FIG. 7.

As shown in FIGS. 7, 8A, and 8B, a compound semiconductor layer 22 is formed on a substrate 10 that is an n-type GaAs substrate. The compound semiconductor layer 22 includes a 2.6-μm thick cladding layer 12 of a first conductivity type that is formed with an n-type AlGaInP layer, a 20-nm thick activation layer 14 that is formed with a MQW (multiquantum well) of AlGaInP/InGaP, a 2.0-μm thick cladding layer 16 of a second conductivity type that is formed with a p-type AlGaInP layer, a 30-nm thick stopper layer 18 that is formed with an InGaP layer, and a 0.2-μm thick p-type contact layer 20 that is formed with a p-type GaAs layer. These layers are stacked in this order. The cladding layer 12 of the first conductivity type and the cladding layer 16 of the second conductivity type have the opposite conductivity types from each other. If the substrate 10 is a p-type GaAs substrate, the cladding layer 12 of the first conductivity type is a p-type cladding layer, and the cladding layer 16 of the second conductivity type is an n-type cladding layer.

As shown in FIGS. 7 and 8A, concave portions 26 are formed by partially removing the p-type contact layer 20, the stopper layer 18, and the cladding layer 16 of the second conductivity type. A ridge portion 28 including part of the p-type contact layer 20, the stopper layer 18, and the cladding layer 16 of the second conductivity type is formed between the concave portions 26. With this arrangement, the compound semiconductor layer 22 has the ridge portion 28. A protection layer 30 formed with a SiN layer is provided to cover the p-type contact layer 20, the stopper layer 18, and the cladding layer 16 of the second conductivity type. The portion of the protection layer 30 located on the ridge portion 28 is removed, and a p-side electrode 32 to be in contact with the p-type contact layer 20 is provided over the protection layer 30. As shown in FIGS. 7 and 8B, a second diffusion region 24 having Zn diffused therein is provided at either end portion of the compound semiconductor layer 22 in the B-B direction, so as to include a light emitting facet 38 for emitting light from the activation layer 14. A low-reflection film (not shown) is provided on the end face 34 of the compound semiconductor layer 22 on the side of the light emitting facet 38, and a high-reflection (not shown) film is provided on the end face 36 on the opposite side.

As shown in FIGS. 7 and 8A, the activation layer 14 is interposed between the cladding layer 12 of the first conductivity type and the cladding layer 16 of the second conductivity type with a low refractive index. Therefore, the light propagating through the compound semiconductor layer 22 is trapped in the vicinity of the activation layer 14. The equivalent refractive index with respect to the light propagating through the vicinity area of the activation layer 14 located below the ridge portion 28 is higher than the equivalent refractive index with respect to the light propagating through the vicinity areas of the activation layer 14 located below the concave portions 26 on both sides of the ridge portion 28. Therefore, the light propagating in the vicinity of the activation layer 14 is trapped in the vicinity area of the activation layer 14 located below the ridge portion 28. The portion that traps the light propagating in the vicinity of the activation layer 14 is called a waveguide 48. As shown in FIG. 8B, the light in the waveguide 48 is reflected by the end faces 34 and 36 on both sides of the compound semiconductor layer 22. In this manner, the light guided along and released from the waveguide 48 is emitted as laser light from the light emitting facet 38. Here, the "equivalent refractive index" is the refractive index sensed by propagating light.

The method for manufacturing the optical semiconductor device in accordance with the first embodiment is the same as the method for manufacturing the optical semiconductor device of Comparative Example 1, except for the formation of the second diffusion regions 24. Therefore, explanation of the same procedures as those illustrated in FIGS. 1A through 1E is omitted herein.

Figure 9A:
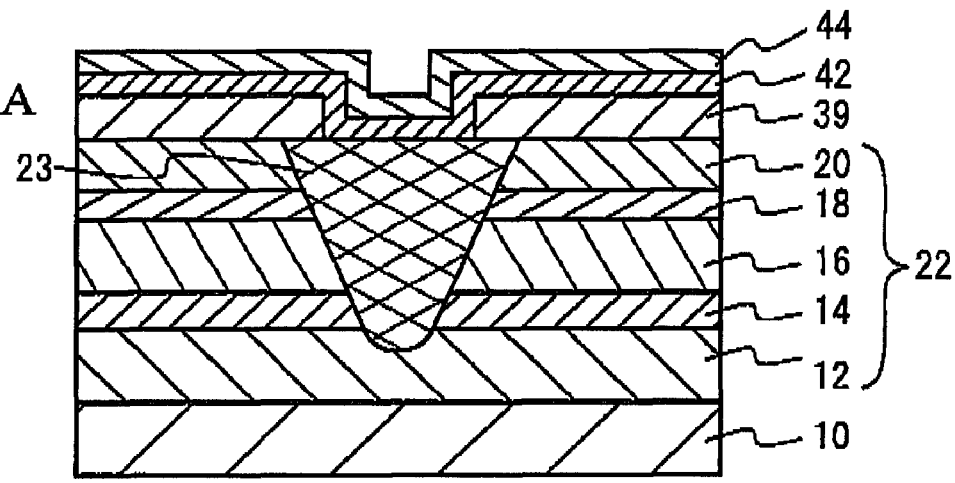
FIGS. 9A through 9C are schematic cross-sectional views illustrating the procedures for forming the second diffusion region in the optical semiconductor device in accordance with the first embodiment.
Figure 9B:
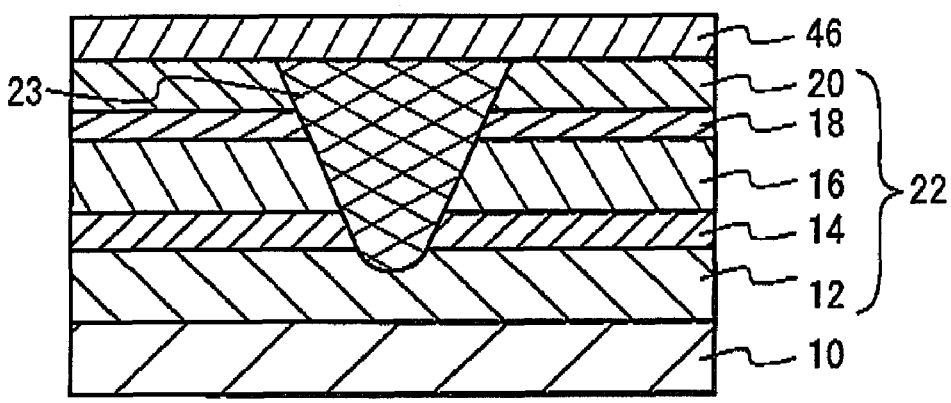
Figure 9C:
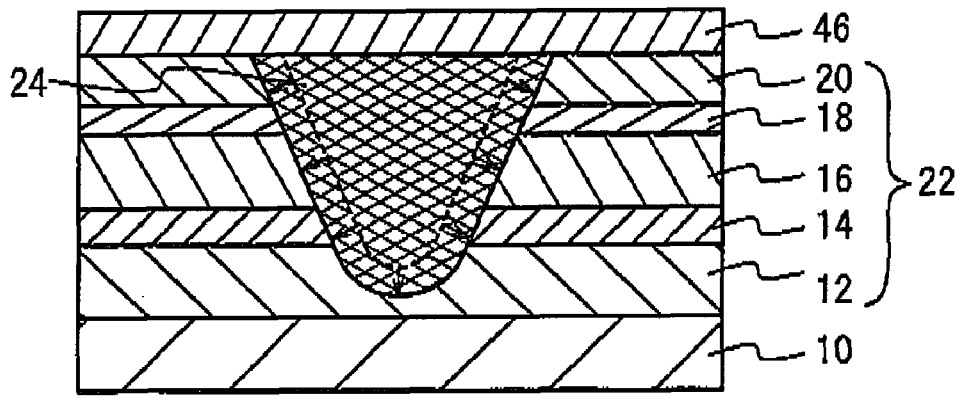

Referring now to FIGS. 9A through 9C, a method for forming the second diffusion region 24 of the optical semiconductor device in accordance with the first embodiment is described. The procedures for forming the second diffusion region 24 up to the procedure of forming the diffusion source layer 42 and the cap layer 44 is the same as the procedures for forming the first diffusion region 23 of the optical semiconductor device of Comparative Example 1. Therefore, explanation of the same procedures as those illustrated in FIGS. 3A through 3B is omitted herein.

As shown in FIG. 9A, with the mask layer 39 serving as a mask, the diffusion source layer 42 is subjected to a first heat treatment at 610° C. for 5 minutes. Through the first heat treatment, the Zn in the diffusion source layer 42 is diffused into the compound semiconductor layer 22, and forms a first diffusion layer or region 23. Since the heat treatment time for forming the first diffusion region 23 is shorter than the heat treatment time for forming the first diffusion region 23 of the optical semiconductor device of Comparative Example 1, the first diffusion region 23 has such a depth as to reach only small part of the activation layer 14.

As shown in FIG. 9B, the mask layer 39, the diffusion source layer 42, and the cap layer 44 are removed. After that, a 75-nm thick first SiN film 46 having a refractive index of 1.9 is formed on the compound semiconductor layer 22.

As shown in FIG. 9C, the first diffusion region 23 is subjected to a second heat treatment carried out by rapid thermal annealing (RTA) at 630° C. for 30 minutes. Through the second heat treatment, the Zn in the first diffusion region 23 is diffused inside the compound semiconductor layer 22, and the second diffusion region 24 that reaches deeper in the compound semiconductor layer 22 than the first diffusion region 23 is formed. Accordingly, the second diffusion region 24 is designed to extend to the activation layer 14. By carrying out these procedures, the second diffusion region 24 of the optical semiconductor device in accordance with the first embodiment is formed.

Figure 10:
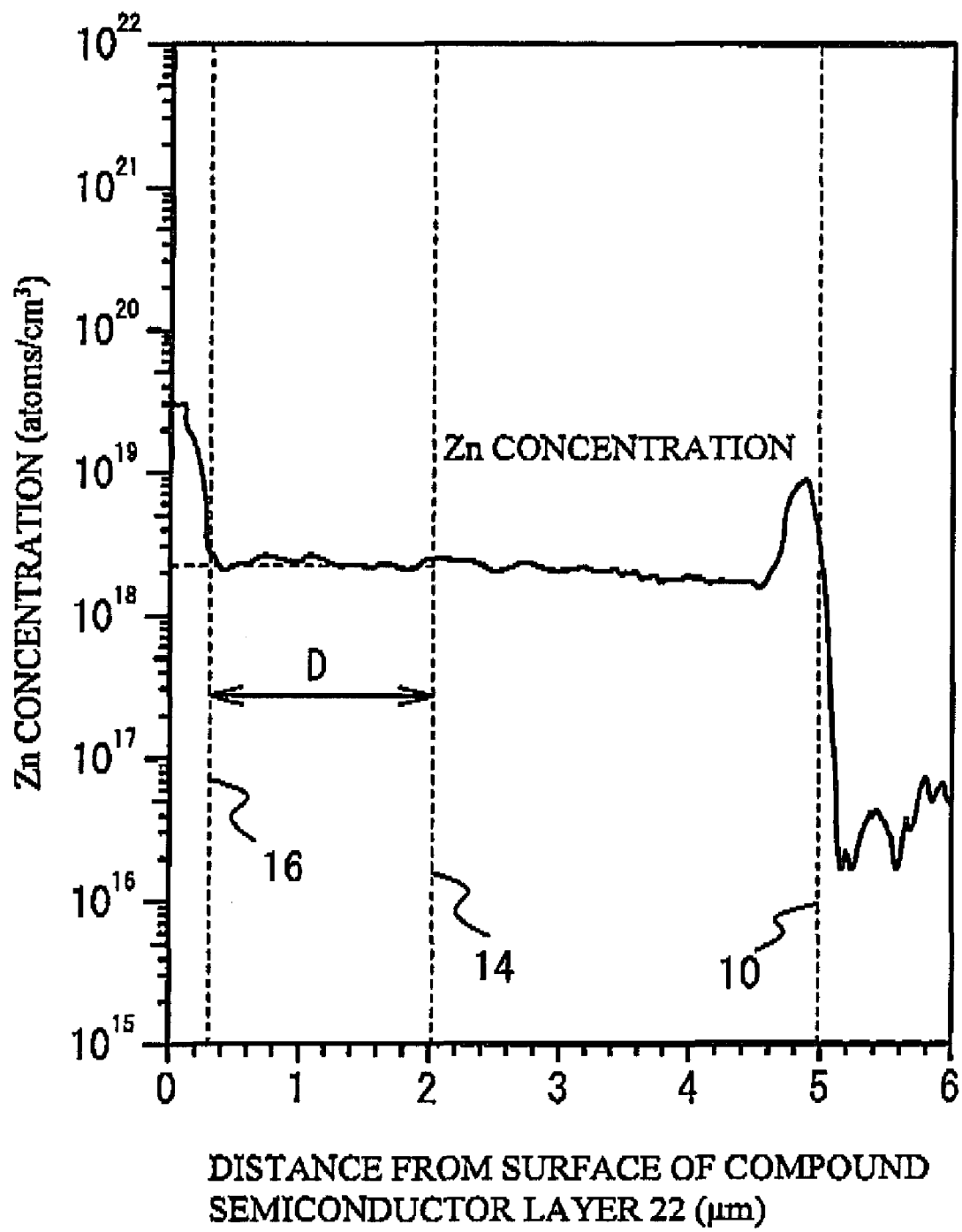
FIG. 10 shows the results of secondary ion mass spectrometric (SIMS) evaluations made on the Zn concentration distribution in the second diffusion region of the optical semiconductor device in accordance with the first embodiment.

FIG. 10 shows the results of secondary ion mass spectrometric (SIMS) evaluations made on the Zn concentration distribution in the second diffusion region 24 of the optical semiconductor device in accordance with the first embodiment. In FIG. 10, the abscissa axis indicates the distance from the surface of the compound semiconductor layer 22, and the ordinate axis indicates the Zn concentration. As can be seen from FIG. 10, the Zn concentration in the activation layer 14 is approximately $2 \times 10^{18}/cm^3$, which is lower than the corresponding Zn concentration in Comparative Example 1. As for the Zn concentration distribution in the area (the area D) extending from the upper face of the cladding layer 16 of the second conductivity type to the lower face of the activation layer 14, FIG. 10 confirms that the ratio of the standard deviation σ in the area D to the mean value in the area D is as low as approximately 6%.

In accordance with the manufacturing method of Comparative Example 1, the Zn concentration in the first diffusion region 23 is high, and the Zn concentration distribution in the area extending from the cladding layer 16 of the second conductivity type to the activation layer 14 is large, as shown in FIG. 4. In accordance with the manufacturing method of the first embodiment, however, the diffusion source layer 42 is subjected to the first heat treatment, to form the shallow first diffusion region 23, as shown in FIG. 9A. After the diffusion source layer 42 as the Zn supply source is removed as shown in FIG. 9B, the first diffusion region 23 is subjected to the second heat treatment, so as to diffuse the Zn of the first diffusion region 23 and turn the first diffusion region 23 into the second diffusion region 24, as shown in FIG. 9C. Accordingly, the Zn concentration in the second diffusion region 24 can be made lower, and the Zn concentration distribution in the area extending from the cladding layer 16 of the second conductivity type to the activation layer 14 can be made uniform, as shown in FIG. 10. Further, after the first SiN film 46 is formed on the compound semiconductor layer 22, as shown in FIG. 9B, the first diffusion region 23 is subjected to the second heat treatment, so that the Zn of the first diffusion region 23 can diffuse toward the inside of the compound semiconductor layer 22.

Figure 11:
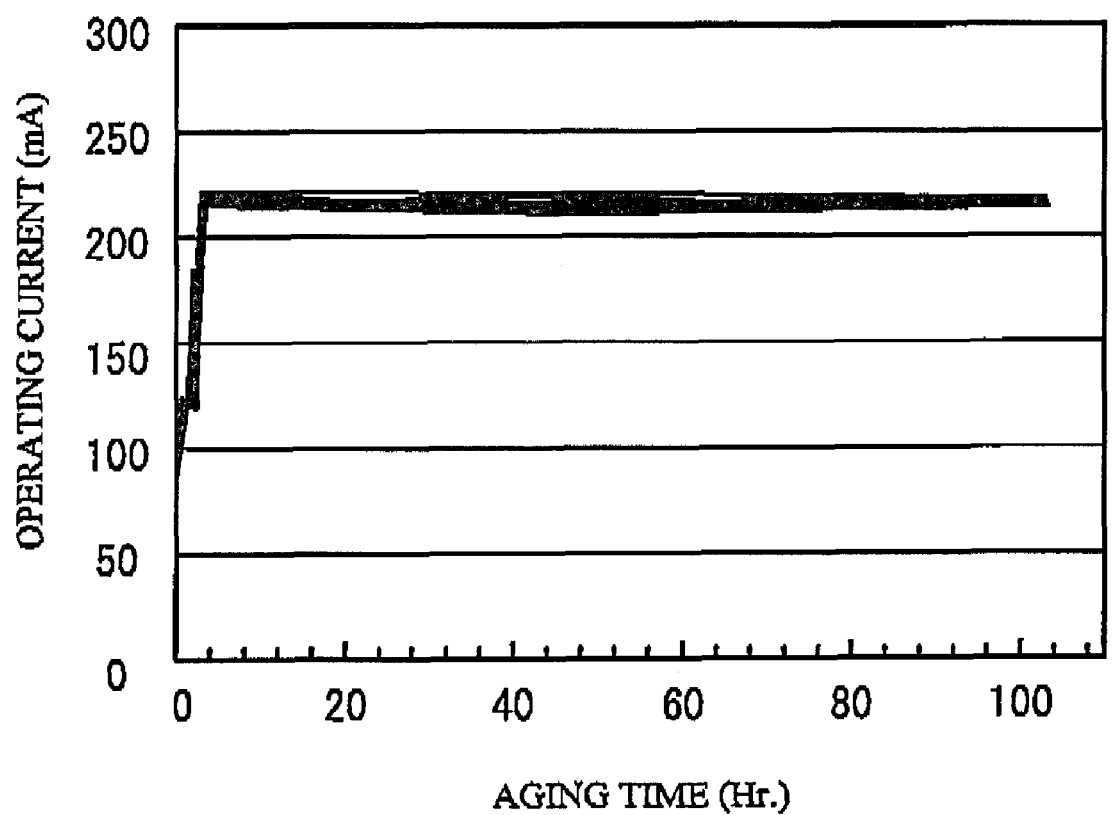
FIG. 11 shows the results of an APC reliability test conducted on the optical semiconductor device in accordance with the first embodiment.
Figure 12:
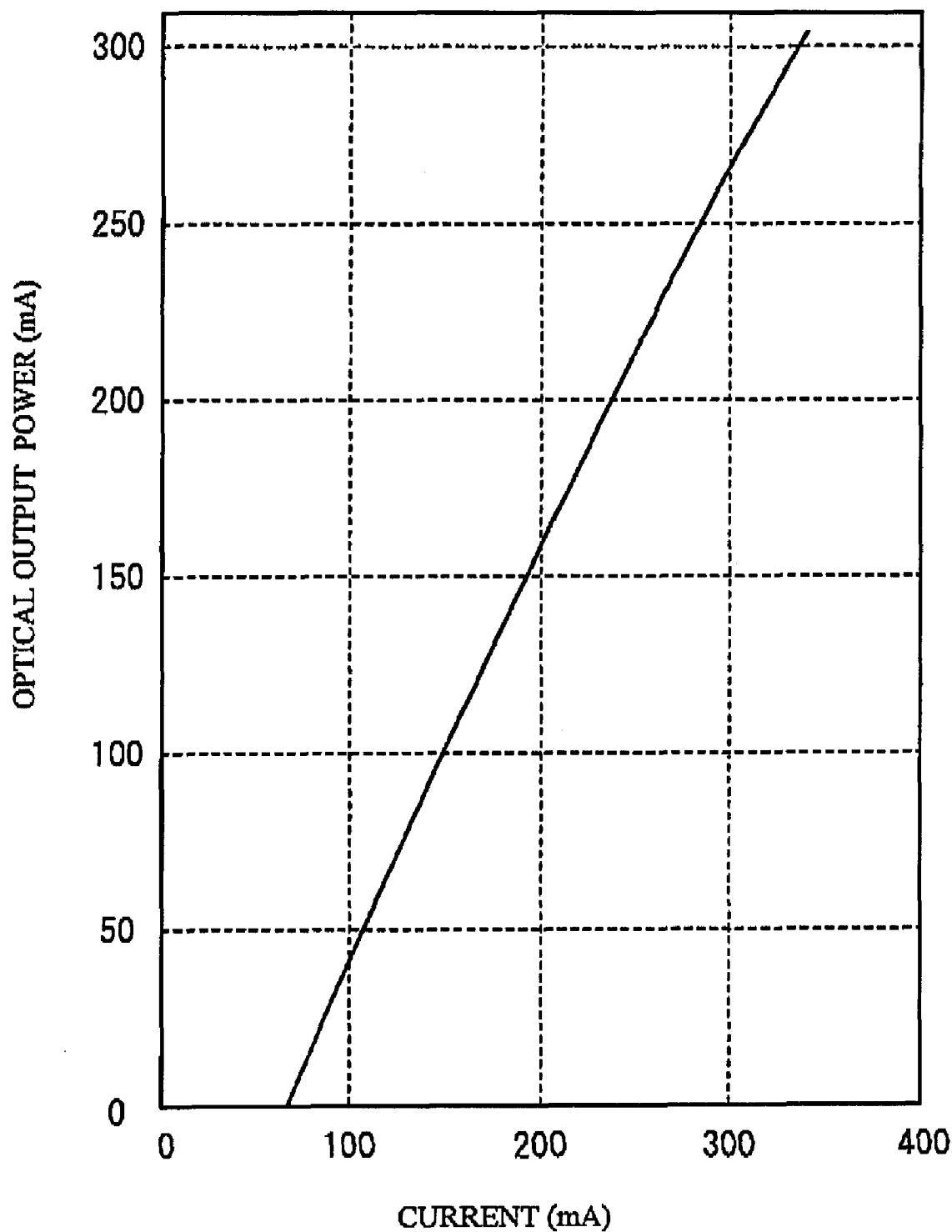
FIG. 12 shows the results of pulse I-L measurement carried out on the optical semiconductor device in accordance with the first embodiment.

FIG. 11 shows the results of an APC reliability test conducted on the optical semiconductor device in accordance with the first embodiment. FIG. 12 shows the results of pulse I-L measurement. As can be seen from FIG. 11, a rapid increase of the operating current is not caused in the APC reliability test conducted for 100 hours, and the operation is stable. As can be seen from FIG. 12, the optical output power increases as the current increases, and reaches 300 mW, which is the defined output.

In accordance with the first embodiment, the Zn concentration in the activation layer 14 is close to the target value (approximately $1 \times 10^{18}/cm^3$), and the Zn concentration distribution in the area extending from the cladding layer 16 of the second conductivity type to the activation layer 14 is uniform, as shown in FIG. 10. Accordingly, breaking due to COD in the vicinity of the light emitting facet 38 can be prevented. Thus, optical semiconductor devices having errors in the APC reliability test can be reduced as shown in FIG. 11, and optical semiconductor devices having the defined outputs through the pulse I-L measurement can be obtained as shown in FIG. 12. In accordance with the first embodiment, a decrease in reliability can be prevented.

Figure 13:
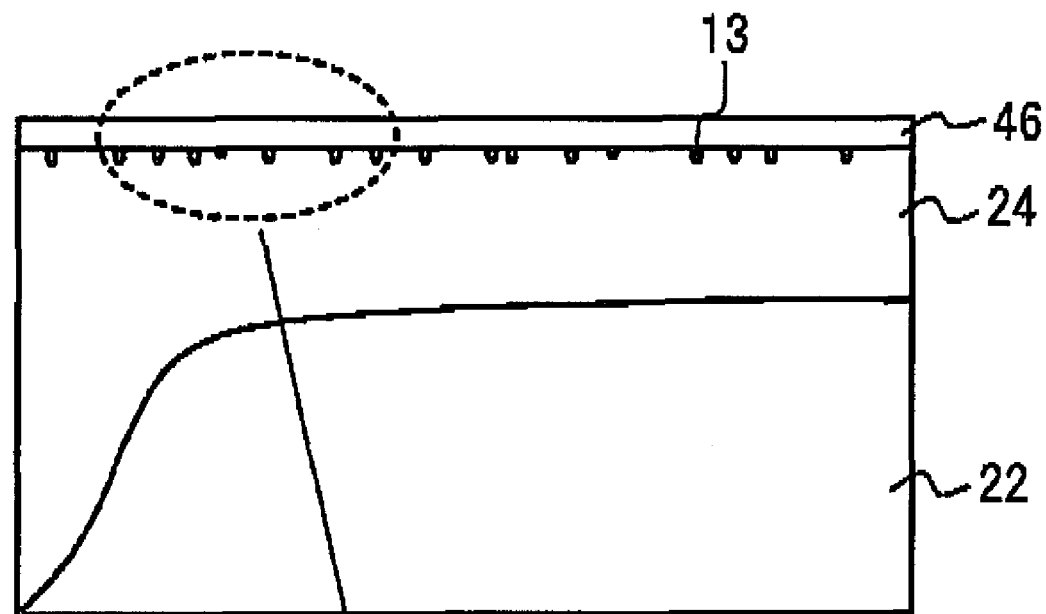
FIG. 13 is a schematic view of a SEM cross-sectional image of the optical semiconductor device taken in a case where the refractive index of the first SiN film is 1.8.
Figure 13:
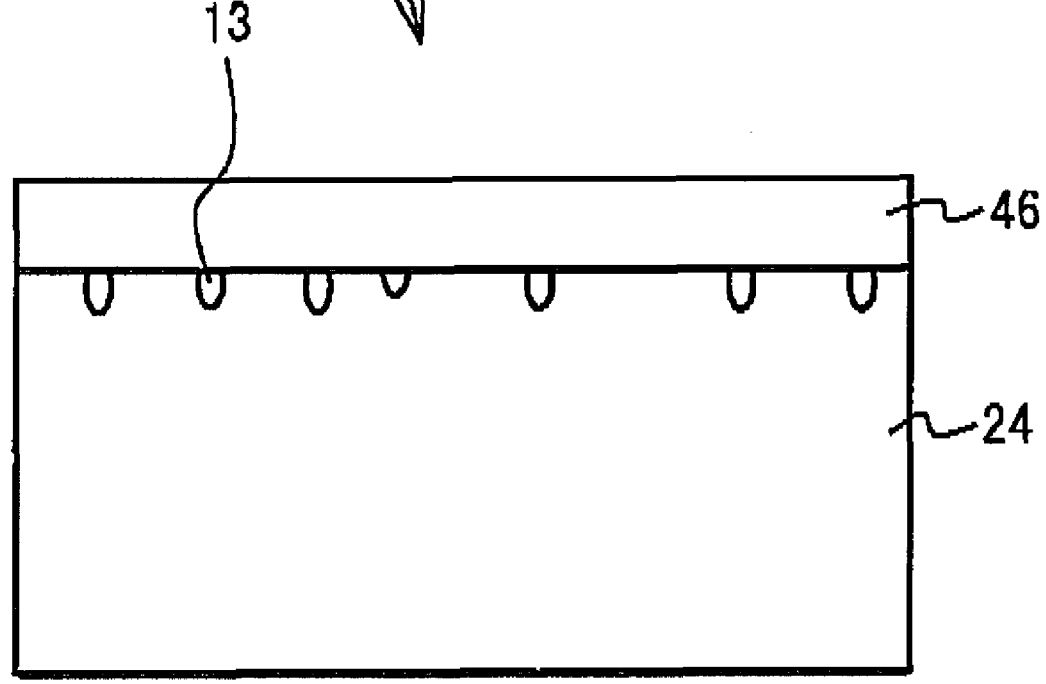
Figure 14A:
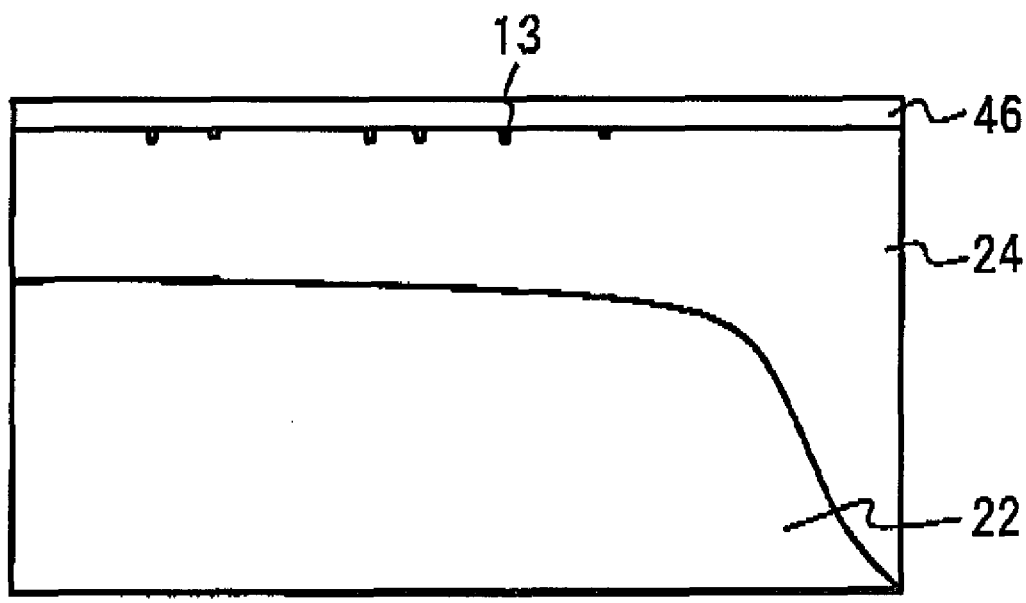
FIG. 14A is a schematic view of a SEM cross-sectional image of the optical semiconductor device taken in a case where the refractive index of the first SiN film is 1.85.
Figure 14B:
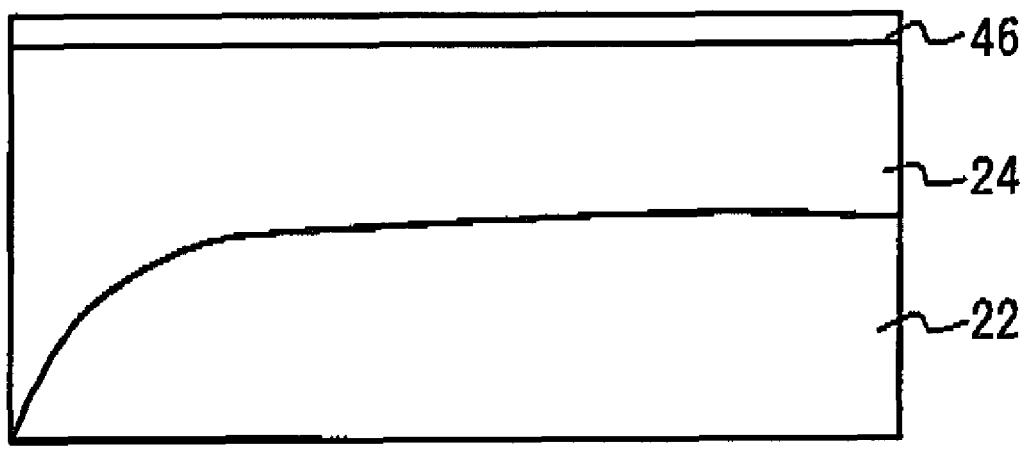
FIG. 14B is a schematic view of a SEM cross-sectional image of the optical semiconductor device taken in a case where the refractive index of the first SiN film is 1.9.

Also, in accordance with the manufacturing method of the first embodiment, the first SiN film 46 having a refractive index of 1.9 is formed on the compound semiconductor layer, as shown in FIG. 9B. The reason that the inventors use the first SiN film having a refractive index of 1.9 is as follows. In the procedures of forming the second diffusion region 24 illustrated in FIGS. 9A through 9C, the inventors conducted experiments in which first SiN films 46 of 1.8, 1.85, and 1.9 in refractive index were used. FIGS. 13, 14A, and 14B are schematic views of SEM cross-sectional images of optical semiconductor devices observed after the procedure illustrated in FIG. 9C was carried out. FIG. 13 shows the case where the first SiN film 46 having the refractive index of 1.8 was used. FIG. 14A shows the case where the first SiN film 46 having the refractive index of 1.85 was used. FIG. 14B shows the case where the first SiN film 46 having the refractive index of 1.9 was used. In the field of optical semiconductors, the refractive index of a regular SiN film is 1.8 to 1.85.

As shown in FIG. 13, in the case of the first SiN film 46 having the refractive index of 1.8, numerous defects 13 are formed in the surface of the second diffusion region 24 formed in the compound semiconductor layer 22. In the case of the first SiN film 46 having the refractive index of 1.85, the number of defects 13 in the surface of the second diffusion region 24 is smaller than in the case of the first SiN film 46 having the refractive index of 1.8, as shown in FIG. 14A. In the case of the first SiN film 46 having the refractive index of 1.9, defects 13 are not seen in the surface of the second diffusion region 24, as shown in FIG. 14B.

The estimated reason that the different refractive indexes cause differences in the number of defects 13 is as follows. If the refractive index of a SiN film is low, the film densification is degraded. Therefore, due to the second heat treatment carried out on the first diffusion region 23 illustrated in FIG. 9C, Ga (gallium), As (arsenic), and the likes in the compound semiconductor layer 22 evaporate to the outside through the first SiN film 46, and the defects 13 are formed in the surface of the compound semiconductor layer 22. In this manner, the defects 13 are formed in the surface of the second diffusion region 24. In view of this, if the compound semiconductor layer 22 contains Ga and As in the form of GaAs, AlGaAs, InGaAs, or the like, the defects 13 tend to appear in the surface of the compound semiconductor layer 22.

Meanwhile, as the temperature of the second heat treatment carried out on the first diffusion region 23 becomes higher, the defects 13 in the surface of the compound semiconductor layer 22 become more noticeable. In a case where the first diffusion region 23 is formed by subjecting the diffusion source layer 42 to a heat treatment in accordance with the manufacturing method of Comparative Example 1 illustrated in FIGS. 2A through 3C, the temperature of the heat treatment is restricted, because the Zn supply becomes too large if the temperature of the heat treatment is high. However, in a case where the second diffusion region 24 is formed by subjecting the diffusion source layer 42 to the first heat treatment and the first diffusion region 23 to the second heat treatment in accordance with the manufacturing method of the first embodiment illustrated in FIGS. 9A through 9C, it is preferable that the temperature of the second heat treatment on the first diffusion region 23 is higher than the temperature of the first heat treatment on the diffusion source layer 42. Accordingly, the defects 13 are easily formed in the first of the compound semiconductor layer 22 in accordance with the manufacturing method of the first embodiment.

Taking those results into consideration, the inventors employ the first SiN film 46 having a refractive index of 1.9 or higher, so as not to form the defects 13 in the surface of the compound semiconductor layer 22 due to the second heat treatment carried out on the first diffusion region 23 illustrated in FIG. 9C. With this arrangement, it is possible to prevent a decrease in the adhesion between the compound semiconductor layer 22 and the protection layer 30 formed on the compound semiconductor layer 22, and an increase in the contact resistance between the p-type contact layer 20 and the p-side electrode 32 formed on the protection layer 30. Particularly, in a case where the compound semiconductor layer 22 contains Ga and As, the effect of the use of the first SiN film 46 having a refractive index of 1.9 or higher becomes greater, because, in such a case, the defects 13 are easily formed in the surface of the compound semiconductor layer 22. Also, the mask layer 39 shown in FIG. 9A may be a SiN film having a refractive index of 1.9 or higher. In that case, it is possible to avoid the defects 13 in the surface of the compound semiconductor layer 22 that might be caused due to the first heat treatment carried out on the diffusion source layer 42 at the time of the formation of the first diffusion region 23.

In accordance with the manufacturing method of the first embodiment, the diffusion source layer 42 is subjected to the first heat treatment at 610° C. for 5 minutes, as shown in FIG. 9A. To form the second diffusion region 24, the first diffusion region 23 is subjected to the second heat treatment at 630° C. for 30 minutes, as shown in FIG. 9C. In this manner, the temperature of the second heat treatment to be carried out to form the second diffusion region 24 is made higher than the first heat treatment to be carried out to form the first diffusion region 23, so that the Zn of the first diffusion region 23 can be diffused into the compound semiconductor layer 22, and the second diffusion region 24 having low Zn concentration and a small concentration distribution can be formed. Particularly, it is preferable that the temperature of the second heat treatment to be carried out on the first diffusion region 23 to form the second diffusion region 24 is in the range of 630° C. to 850° C.

Also, as shown in FIG. 9C, rapid thermal annealing (RTA) is used in the second heat treatment carried out on the first diffusion region 23 to form the second diffusion region 24. However, the present invention is not limited to that arrangement, and it is possible to use some other technique, such as furnace annealing. It is also possible to use rapid thermal annealing, furnace annealing, or the like in the first heat treatment to be carried out on the diffusion source layer 42 to form the first diffusion region 23 shown in FIG. 9A.

Further, the diffusion source layer 42 contains Zn, and the Zn is diffused to form the second diffusion region 24. However, the present invention is not limited to that arrangement, and the diffusion source layer 42 may contain some other impurities, as long as breaking in the vicinity of the light emitting facet 38 due to COD can be prevented.

Second Embodiment

A second embodiment of the present invention is an example case where a third diffusion region is formed by subjecting the second diffusion region 24 to a third heat treatment after the formation of the second diffusion region 24 through the second heat treatment. The structure of an optical semiconductor device in accordance with the second embodiment is the same as the structure in accordance with the first embodiment, except that the third diffusion region 25 is provided in place of the second diffusion region 24. Therefore, explanation of the same aspects as those illustrated in FIGS. 7, 8A, and BB is omitted herein. Also, the manufacturing method is the same as the method of the first embodiment, except for the procedure of forming the third diffusion region 25 by subjecting the second diffusion region 24 to the third heat treatment. Therefore, explanation of the same procedures as those illustrated in FIGS. 1A through 1E and FIGS. 9A through 9C is omitted herein.

Figure 15A:
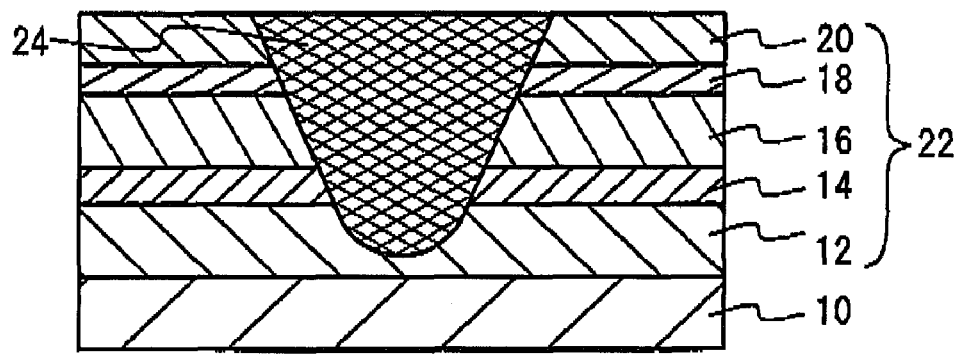
FIGS. 15A through 15C are schematic cross-sectional views illustrating the procedures for forming a third diffusion region in an optical semiconductor device in accordance with a second embodiment of the present invention.
Figure 15B:
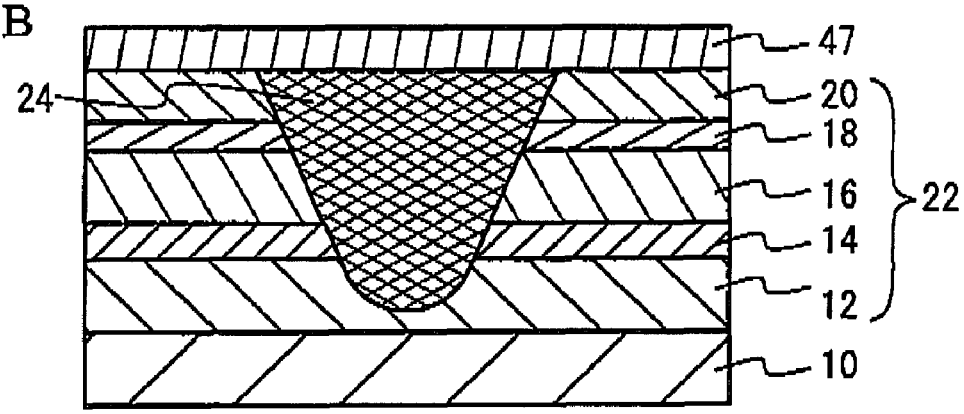
Figure 15C:
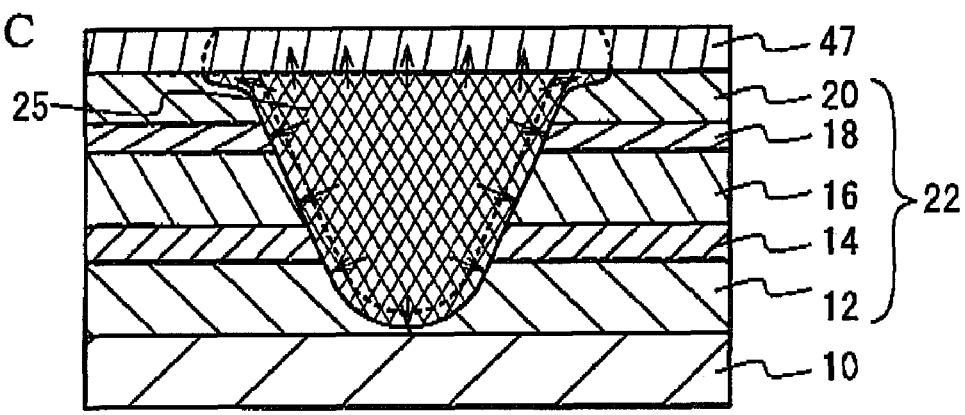

Referring now to FIGS. 15A through 15C, the procedure of forming the third diffusion region 25 by subjecting the second diffusion region 24 to the third heat treatment is described. By carrying out the procedures illustrated in FIGS. 9A through 9C, the second diffusion region 24 is formed. After that, the first SiN film 46 is removed as shown in FIG. 15A.

As shown in FIG. 15B, a 150-nm thick second SiN film 47 having a refractive index of 1.85 is formed on the compound semiconductor layer 22. It is preferable that the refractive index of the second SiN film 47 is 1.87 or lower. The reason for the use of a SiN film having a refractive index of 1.87 or lower is as follows. As already described with reference to FIG. 13 and FIGS. 14A and 14B, a SiN film having a low refractive index has poor film densification, and therefore, the substances diffused due to a heat treatment are trapped in the SiN film. With such characteristics being taken into account, the second SiN film 47 having relatively low film densification and a refractive index of 1.87 or lower is used, so that the Zn diffused due to the heat treatment is trapped in the second SiN film 47.

As shown in FIG. 15C, the second diffusion region 24 is subjected to the 600° C. 30-minute third heat treatment by performing rapid thermal annealing (RTA), so as to form the third diffusion region 25. Here, the refractive index of the second SiN film 47 is 1.85, which is lower than the refractive index (1.9) of the first SiN film 46 used to form the second diffusion region 24. Therefore, more defects 13 are formed in the third heat treatment, as described with reference to FIG. 13 and FIGS. 14A and 14B. However, the temperature of the third heat treatment is made lower than the temperature of the second heat treatment, so as not to form the defects 13. Accordingly, the preferred temperature of the third heat treatment is 550° C. to 600° C. Also, a SiN film having a low refractive index has poor film densification, and easily traps diffused substances, as described above. Accordingly, the Zn in the second diffusion region 24 is diffused due to the third heat treatment, and is trapped in the second SiN film 47. In the third heat treatment, furnace annealing or the like may be performed, instead of rapid thermal annealing.

Figure 16:
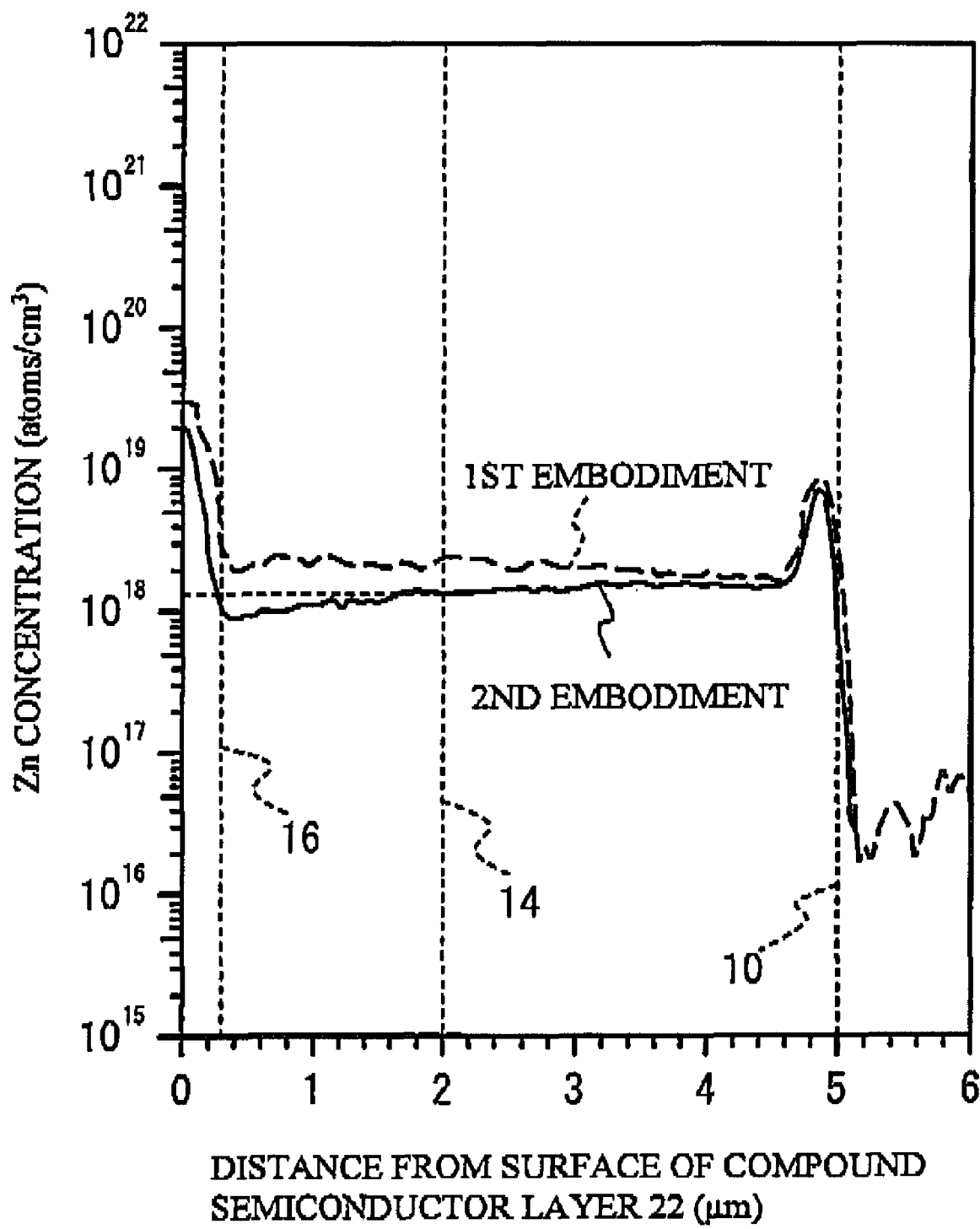
FIG. 16 shows the results of secondary ion mass spectrometric (SIMS) evaluations made on the Zn concentration distribution in the third diffusion region of the optical semiconductor device in accordance with the second embodiment.

FIG. 16 shows the results of secondary ion mass spectrometric (SIMS) evaluations made on the Zn concentration distribution of the optical semiconductor device in accordance with the first embodiment and the second embodiment. In FIG. 16, the abscissa axis indicates the distance from the surface of the compound semiconductor layer 22, and the ordinate axis indicates the Zn concentration. The solid-line graph in FIG. 16 represents the concentration profile of the third diffusion region 25 of the second embodiment, and the broken-line graph represents the concentration profile of the second diffusion region 24 of the first embodiment. As can be seen from FIG. 16, the second embodiment further reduces the Zn concentration in the activation layer 14, compared with the first embodiment. This is because the Zn in the second diffusion region 24 is trapped in the second SiN film 47 due to the third heat treatment.

Figure 17:
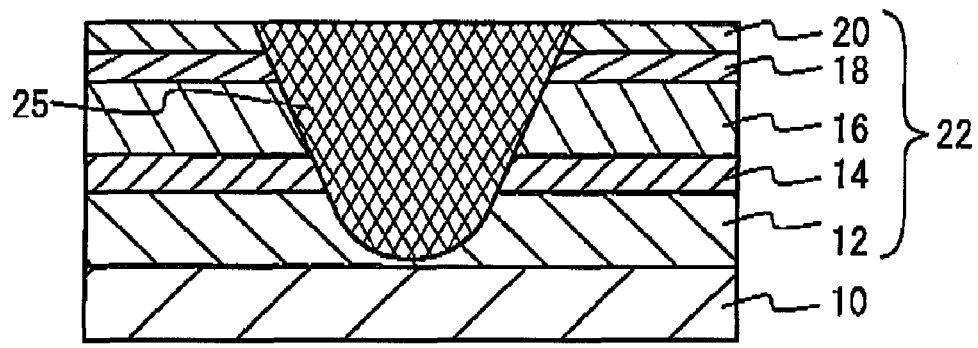
FIG. 17 is a schematic cross-sectional view illustrating the procedure for removing the second SiN film and the surface of the compound semiconductor layer.

After the third heat treatment is carried out as shown in FIG. 15C, the Zn is diffused into the second SiN film 47 and the surface of the p-type contact layer 20, and the Zn concentration in the second SiN film 47 and the surface of the p-type contact layer 20 becomes higher. The Zn diffused into the second SiN film 47 and the surface of the p-type contact layer 20 moves again toward the inside of the compound semiconductor layer 22 while the optical semiconductor device is operating in a high-temperature, high-field state. As a result, the reliability of the optical semiconductor device becomes lower. Therefore, after the third diffusion region 25 is formed through the third heat treatment, it is preferable to remove the second SiN film 47 and then remove the surface portion of the p-type contact layer 20, as shown in FIG. 17. A 50-nm surface portion of the p-type contact layer 20 may be removed by a wet etching technique, for example. Alternatively, only the second SiN film 47 may be removed, instead of both the second SiN film 47 and the surface portion of the p-type contact layer 20.

In the second embodiment, excellent results can also be achieved in the APC reliability test and the pulse I-L measurement, and a decrease in reliability can be prevented as in the first embodiment.

Third Embodiment

A third embodiment of the present invention is an example case where the conditions for the first heat treatment and the conditions for the second heat treatment differ from those in the first embodiment. The structure of an optical semiconductor device in accordance with the third embodiment is the same as the structure in accordance with the first embodiment. Therefore, explanation of the same aspects as those illustrated in FIGS. 7, 8A, and 8B is omitted herein. Also, the manufacturing method is the same as the method of the first embodiment, except that the first heat treatment on the diffusion source layer 42 is carried out at 610° C. for 2 minutes to form the first diffusion region 23, and the second heat treatment on the first diffusion region 23 is carried out at 630° C. for 5 minutes to form the second diffusion region 24. Therefore, explanation of the same procedures as those illustrated in FIGS. 1A through 1E and FIGS. 9A through 9C is omitted herein.

Figure 18:
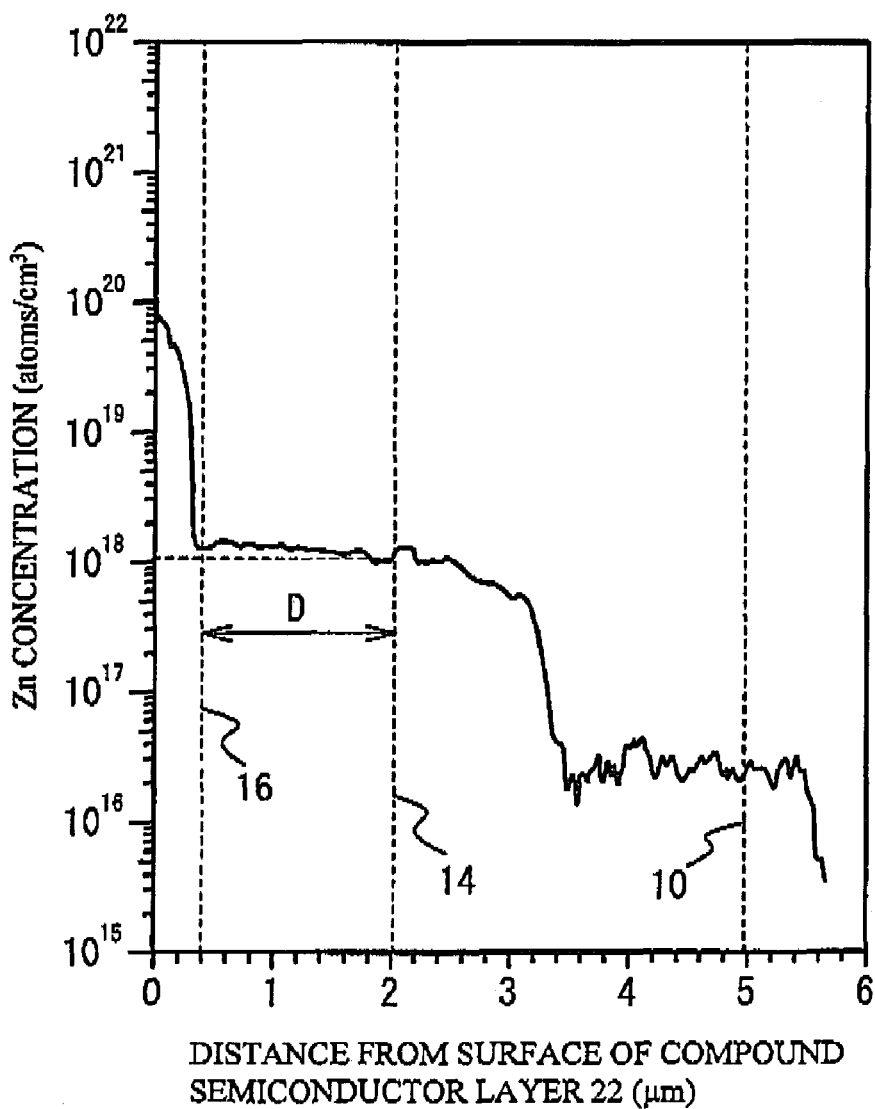
FIG. 18 shows the results of secondary ion mass spectrometric (SIMS) evaluations made on the Zn concentration distribution in the second diffusion region of an optical semiconductor device in accordance with a third embodiment of the present invention.

FIG. 18 shows the results of secondary ion mass spectrometric (SIMS) evaluations made on the Zn concentration distribution in the second diffusion region 24 of the optical semiconductor device in accordance with the third embodiment. In FIG. 18, the abscissa axis indicates the distance from the surface of the compound semiconductor layer 22, and the ordinate axis indicates the Zn concentration. As can be seen from FIG. 18, the Zn concentration in the activation layer 14 is approximately $1 \times 10^{18}/cm^3$. As for the Zn concentration distribution in the area (the area D) extending from the upper face of the cladding layer 16 of the second conductivity type to the lower face of the activation layer 14, FIG. 18 confirms that the ratio of the standard deviation σ in the area D to the mean value in the area D is as low as approximately 9%.

Figure 19:
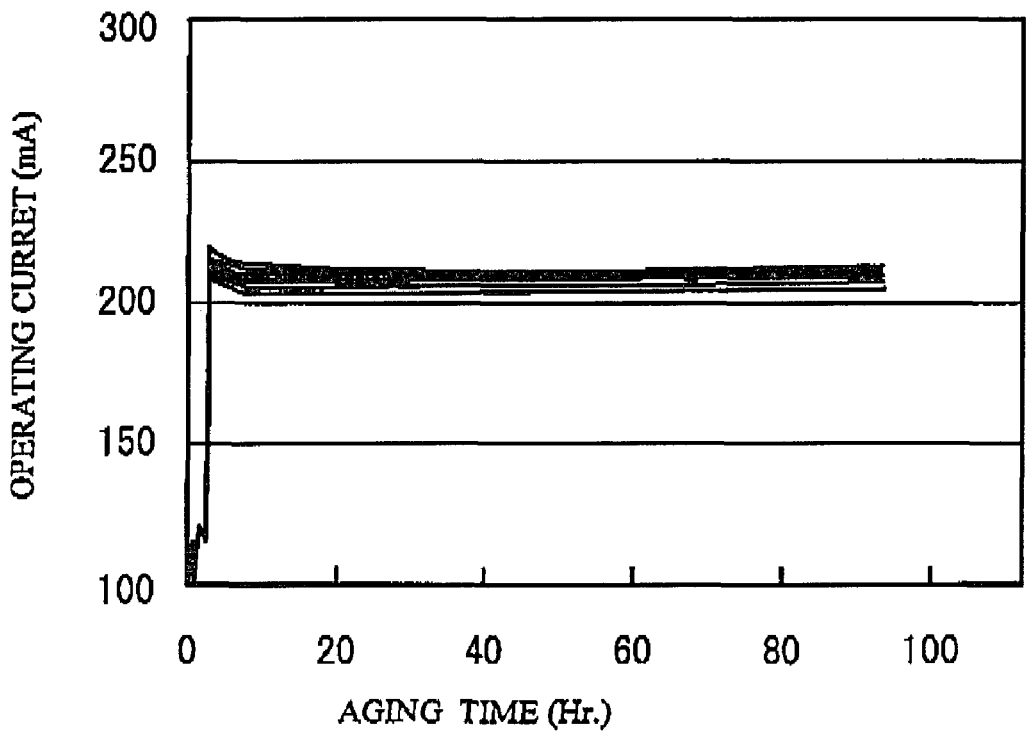
FIG. 19 shows the results of an APC reliability test conducted on the optical semiconductor device in accordance with the third embodiment.
Figure 20:
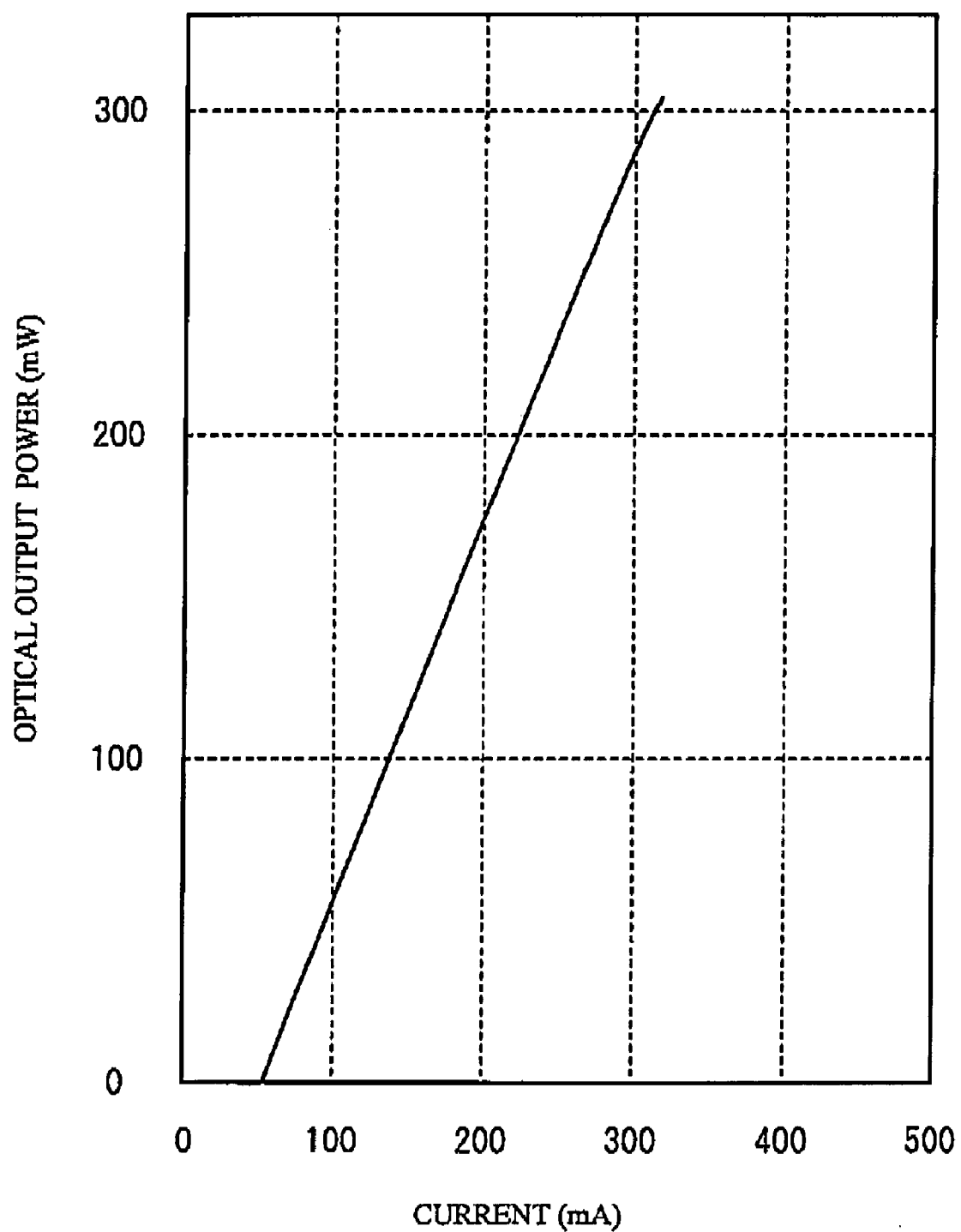
FIG. 20 shows the results of pulse I-L measurement carried out on the optical semiconductor device in accordance with the third embodiment.

FIG. 19 shows the results of an APC reliability test conducted on the optical semiconductor device in accordance with the third embodiment. FIG. 20 shows the results of pulse I-L measurement. As can be seen from FIG. 19, a rapid increase of the operating current is not caused in the APC reliability test conducted for 100 hours, and the operation is stable. As can be seen from FIG. 20, the optical output power increases as the current increases, and reaches 300 mW, which is the defined output. In the third embodiment, a decrease in reliability can also be prevented.

In the third embodiment, to form the first diffusion region 23, the first heat treatment on the diffusion source layer is carried out at 610° C. for 2 minutes. To form the second diffusion region 24, the second heat treatment on the first diffusion region 23 is carried out at 630° C. for 5 minutes. Therefore, the area having the Zn concentration of $1 \times 10^{18}/cm^3$ does not extend to the substrate 10, or the second diffusion region 24 does not extend to the substrate 10.

Figure 21:
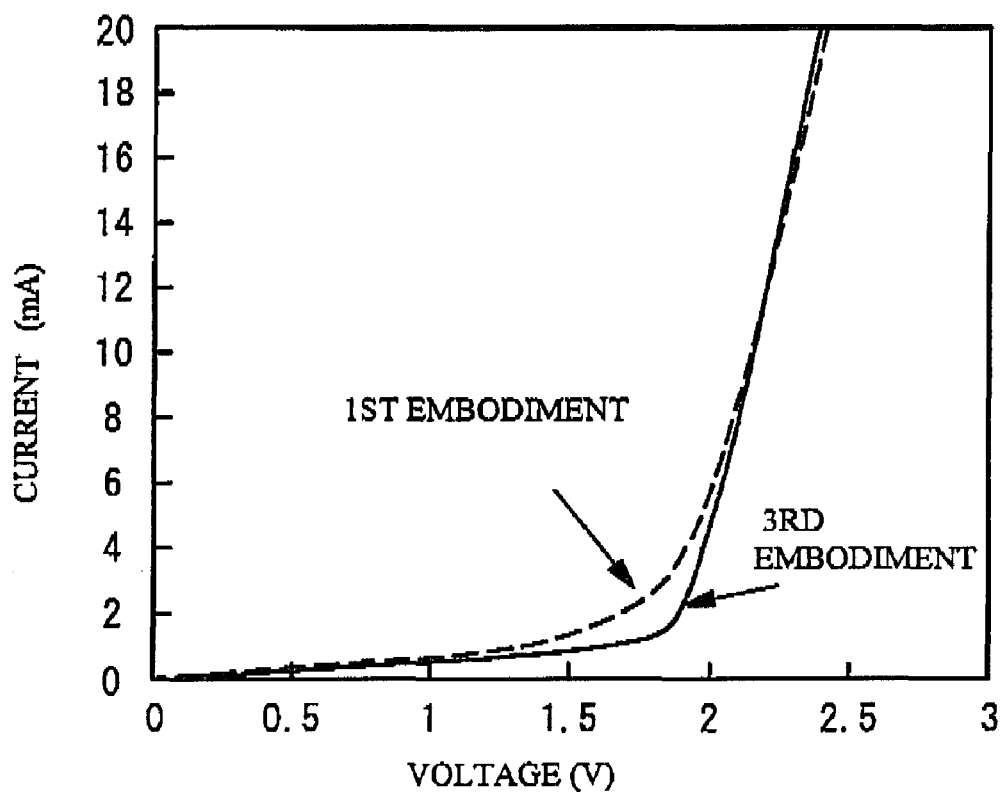
FIG. 21 shows the results of I-V measurement carried out on the optical semiconductor device in accordance with the first embodiment and the optical semiconductor device in accordance with the third embodiment.

FIG. 21 shows the I-V characteristics of the first embodiment in which the second diffusion region 24 extends to the substrate 10 (see FIG. 10), and the I-V characteristics of the third embodiment in which the second diffusion region 24 does not extend to the substrate 10. As can be seen from FIG. 21, the current in the third embodiment is lower than the current in the first embodiment in the area between 1.0V and 2.2V. This is because, where the second diffusion region 24 does not extend to the substrate 10, leakage current flowing from the p-side electrode 32 into the substrate 10 via the second diffusion region 24 can be prevented. As the current flowing in the second diffusion region 24 is restrained, the heat generation in the second diffusion region can also be prevented. In this manner, breaking in the vicinity of the light emitting facet 38 due to heat absorption can be prevented. Thus, the optical semiconductor device in accordance with the third embodiment can have higher reliability than the optical semiconductor device in accordance with the first embodiment. Accordingly, it is preferable that the second diffusion region 24 is designed so as not to extend to the substrate 10. For the same reason, it is also preferable that the third diffusion region 25 of the second embodiment is designed so as not to extend to the substrate 10.

In the first through third embodiments, the Zn concentration in the activation layer 14 is approximately $2 \times 10^{18}/cm^3$ or approximately $1 \times 10^{18}/cm^3$, as shown in FIGS. 10, 16, and 18. However, a decrease in the reliability of an optical semiconductor device can be prevented as in the first through third embodiments, as long as the Zn concentration in the activation layer 14 is within the range of $0.5 \times 10^{18}/cm^3$ to $5 \times 10^{18}/cm^3$. It is particularly preferable that the Zn concentration in the activation layer 14 is within the range of $0.5 \times 10^{18}/cm^3$ to $2 \times 10^{18}/cm^3$.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present application is based on Japanese Patent Application Nos. 2007-195635 filed Jul. 27, 2007 and 2008-177391 filed Jul. 7, 2008, the entire disclosure of which is hereby incorporated by reference.

What is claimed is:

1. A method for manufacturing an optical semiconductor device that has a compound semiconductor layer on a substrate, the compound semiconductor layer including a cladding layer of a first conductivity type, an activation layer, a cladding layer of a second conductivity type that is the opposite of the first conductivity type,
the method comprising the steps of:
   forming a diffusion source layer on the compound semiconductor layer;
   forming a first diffusion region in the compound semiconductor layer by carrying out a first heat treatment, the first diffusion region including a light emitting facet for emitting light from the activation layer;
   removing the diffusion source layer;
   forming a first SiN film having a refractive index of 1.9 or higher on the compound semiconductor layer; and
   turning the first diffusion region into a second diffusion region by carrying out a second heat treatment.

2. The method as claimed in claim 1, wherein a temperature of the second heat treatment is higher than a temperature of the first heat treatment.

3. The method as claimed in claim 1, wherein the step of turning the first diffusion region into the second diffusion region includes forming the second diffusion region so as not to extend to the substrate.

4. The method as claimed in claim 1, wherein rapid thermal annealing or furnace annealing is performed in the first heat treatment and the second heat treatment.

5. The method as claimed in claim 1, further comprising the steps of:
   removing the first SiN film;
   forming a second SiN film having a refractive index of 1.87 or lower on the compound semiconductor layer; and
   turning the second diffusion region into a third diffusion region by carrying out a third heat treatment.

6. The method as claimed in claim 5, wherein a temperature of the third heat treatment is lower than a temperature of the second heat treatment.

7. The method as claimed in claim 5, further comprising the step of
   removing the second SiN film, the step of removing the second SiN film being carried out after the step of forming the third diffusion region.

8. The method as claimed in claim 7, further comprising the step of
   removing a surface of the compound semiconductor layer, the step of removing the surface of the compound semiconductor layer being carried out after the step of removing the second SiN film.

9. The method as claimed in claim 5, wherein rapid thermal annealing or furnace annealing is performed in the third heat treatment.

10. The method as claimed in claim 1, wherein the compound semiconductor layer contains Ga and As.

11. The method as claimed in claim 1, wherein the diffusion source layer contains Zn.

12. An optical semiconductor device comprising:
   a compound semiconductor layer that is provided on a substrate and includes a cladding layer of a first conductivity type, an activation layer, and a cladding layer of a second conductivity type that is the opposite of the first conductivity type; and
   one of a second diffusion region and a third diffusion region is provided in the compound semiconductor layer, the one of the second diffusion region and the third diffusion region including a light emitting facet for emitting light from the activation layer,
   the second diffusion region being annealed with being covered with a SiN film having a refractive index of 1.9 or higher,
   the third diffusion region being annealed with being covered with a SiN film having a refractive index of 1.87 or lower.

13. The optical semiconductor device as claimed in claim 12, wherein the one of the second diffusion region and the third diffusion region does extend to the substrate.

14. The optical semiconductor device as claimed in claim 12, wherein the compound semiconductor layer has a ridge portion.

* * * * *